United States Patent
Lu et al.

(10) Patent No.: US 12,125,910 B2
(45) Date of Patent: Oct. 22, 2024

(54) TRANSISTOR STRUCTURE WITH INCREASED GATE DIELECTRIC THICKNESS BETWEEN GATE-TO-DRAIN OVERLAP REGION

(71) Applicants: INVENTION AND COLLABORATION LABORATORY PTE. LTD., Singapore (SG); ETRON TECHNOLOGY, INC., Hsinchu (TW)

(72) Inventors: Chao-Chun Lu, Hsinchu (TW); Ming-Hong Kuo, Hsinchu (TW); Chun-Nan Lu, Hsinchu (TW)

(73) Assignees: INVENTION AND COLLABORATION LABORATORY PTE. LTD., Singapore (SG); ETRON TECHNOLOGY, INC., Hsinchu (TW)

( * ) Notice: Subject to any disclaimer, the term of this patent is extended or adjusted under 35 U.S.C. 154(b) by 0 days.

(21) Appl. No.: 17/828,304

(22) Filed: May 31, 2022

(65) Prior Publication Data
US 2022/0393028 A1    Dec. 8, 2022

Related U.S. Application Data

(60) Provisional application No. 63/195,743, filed on Jun. 2, 2021.

(51) Int. Cl.
*H01L 29/78*    (2006.01)
*H01L 29/66*    (2006.01)

(52) U.S. Cl.
CPC ...... *H01L 29/7836* (2013.01); *H01L 29/6659* (2013.01)

(58) Field of Classification Search
CPC ............. H01L 29/42368; H01L 29/66621
See application file for complete search history.

(56) References Cited

U.S. PATENT DOCUMENTS

| | | | | |
|---|---|---|---|---|
| 2006/0273388 A1* | 12/2006 | Yamazaki | ............ | H10B 12/053 257/E21.429 |
| 2008/0061320 A1* | 3/2008 | von Kluge | ............ | H10B 12/053 257/E21.429 |
| 2015/0340368 A1 | 11/2015 | Oshima | | |

FOREIGN PATENT DOCUMENTS

| | | |
|---|---|---|
| JP | 2003-282869 A | 10/2003 |
| JP | 2008-530800 A | 8/2008 |

(Continued)

OTHER PUBLICATIONS

Japanese Office Action for Japanese Application No. 2022-117535, dated Dec. 5, 2023, with English translation.

(Continued)

*Primary Examiner* — Xiaoming Liu
(74) *Attorney, Agent, or Firm* — Birch, Stewart, Kolasch & Birch, LLP

(57) ABSTRACT

A transistor structure includes a gate conductive region, a gate dielectric region, a channel region and a drain region. The gate conductive region is below an original surface of a substrate. The gate dielectric region surrounds the gate conductive region. The channel region surrounds the gate dielectric region. The drain region is horizontally spaced apart from the gate conductive region, wherein the drain region includes a highly doped region; wherein the gate dielectric region includes a first dielectric portion and a second dielectric portion, the first dielectric portion is positioned between the gate conductive region and the highly doped region, and the second dielectric portion is positioned between the gate conductive region and the channel region; wherein a horizontal thickness of the first dielectric portion is greater than that of the second dielectric portion.

5 Claims, 24 Drawing Sheets

(56) References Cited

FOREIGN PATENT DOCUMENTS

| KR | 10-0714900 B1 | 5/2007 |
|----|---------------|--------|
| TW | 200818468 A | 4/2008 |
| WO | WO 2014/103734 A1 | 7/2014 |
| WO | WO 2014/125950 A1 | 8/2014 |

OTHER PUBLICATIONS

Japanese Office Action for Japanese Application No. 2022-117537, dated Dec. 5, 2023, with English translation.
Taiwanese Office Action and Search Report for Taiwanese Application No. 111120281, dated Feb. 14, 2023.
Korean Office Action for Korean Application No. 10-2022-0091245, dated Dec. 13, 2023, with English translation.

\* cited by examiner

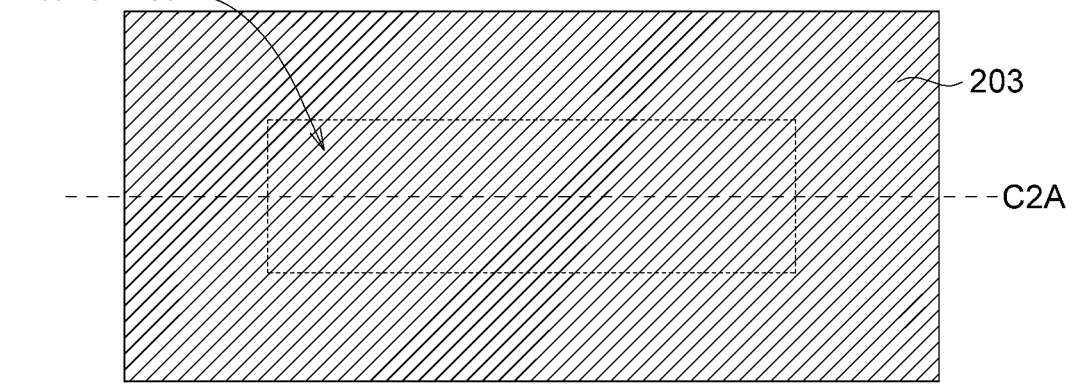
FIG. 2A(1)
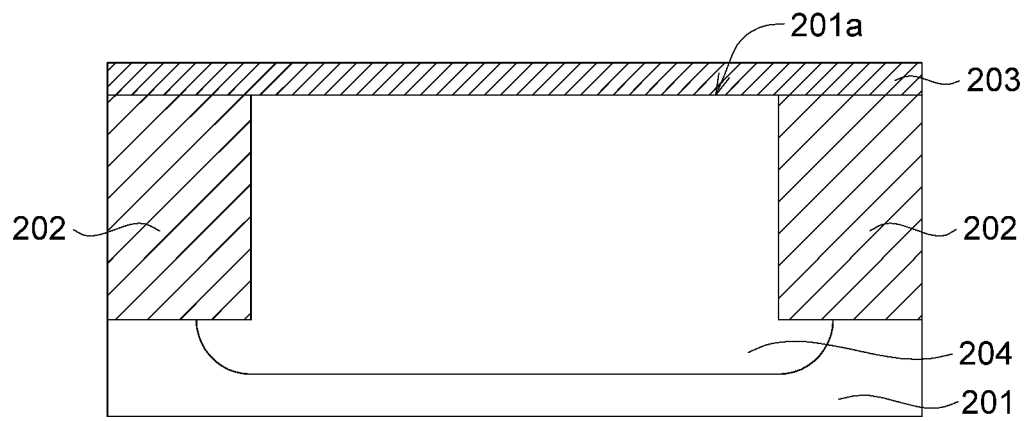
FIG. 2A(2)

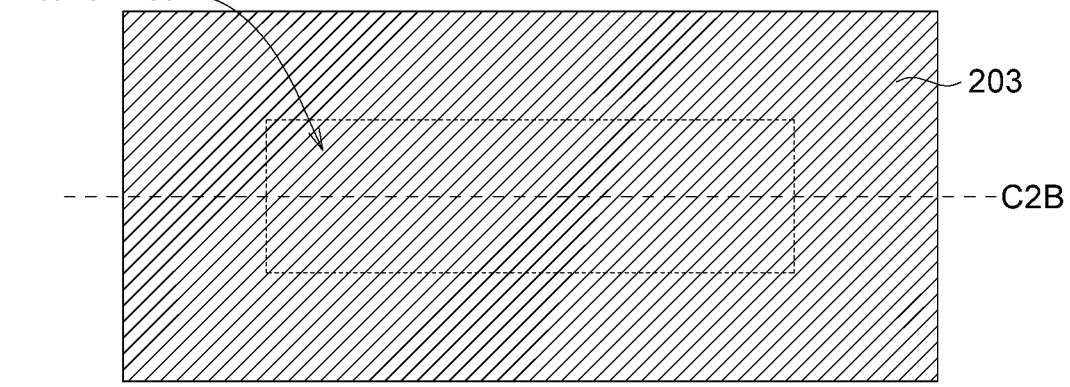
FIG. 2B(1)
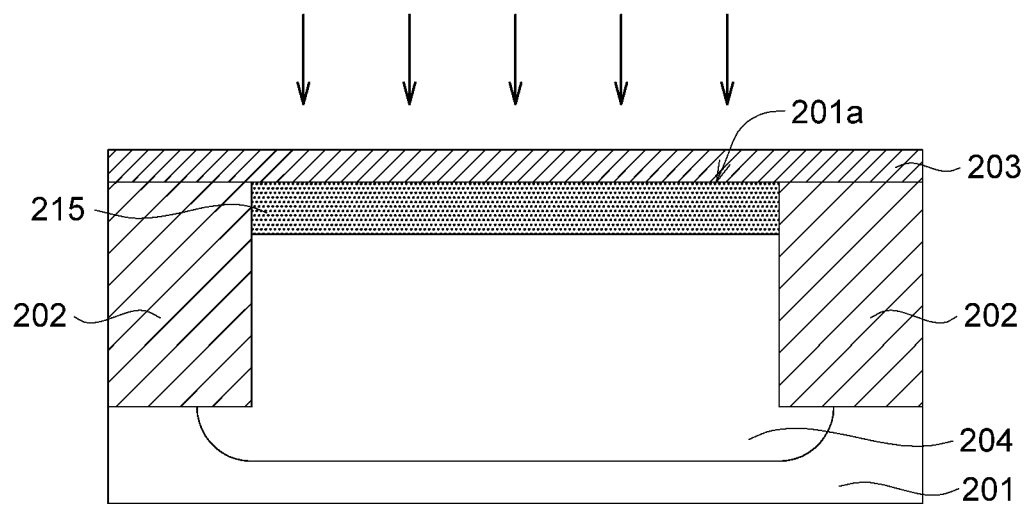
FIG. 2B(2)

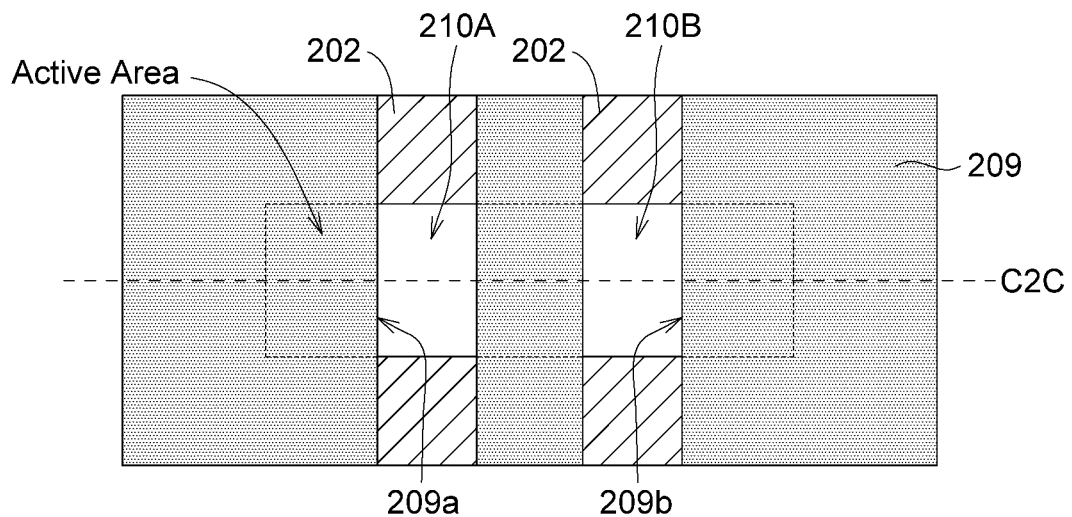
FIG. 2C(1)
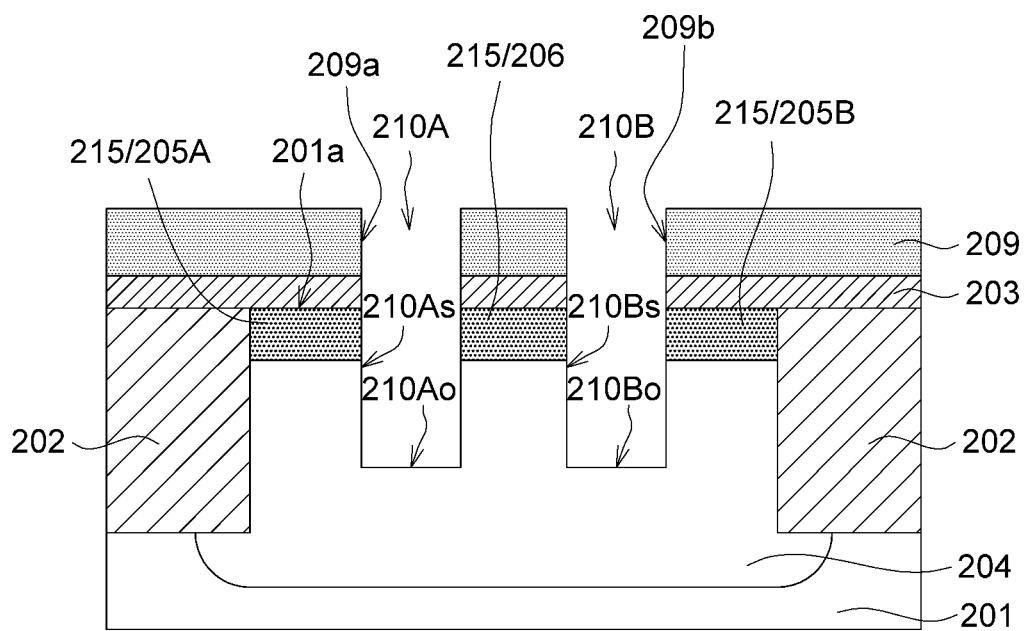
FIG. 2C(2)

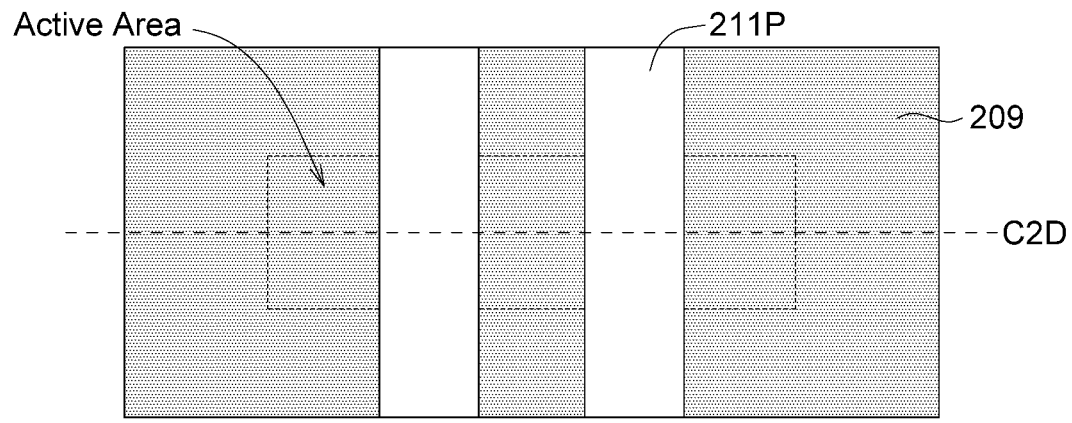
FIG. 2D(1)
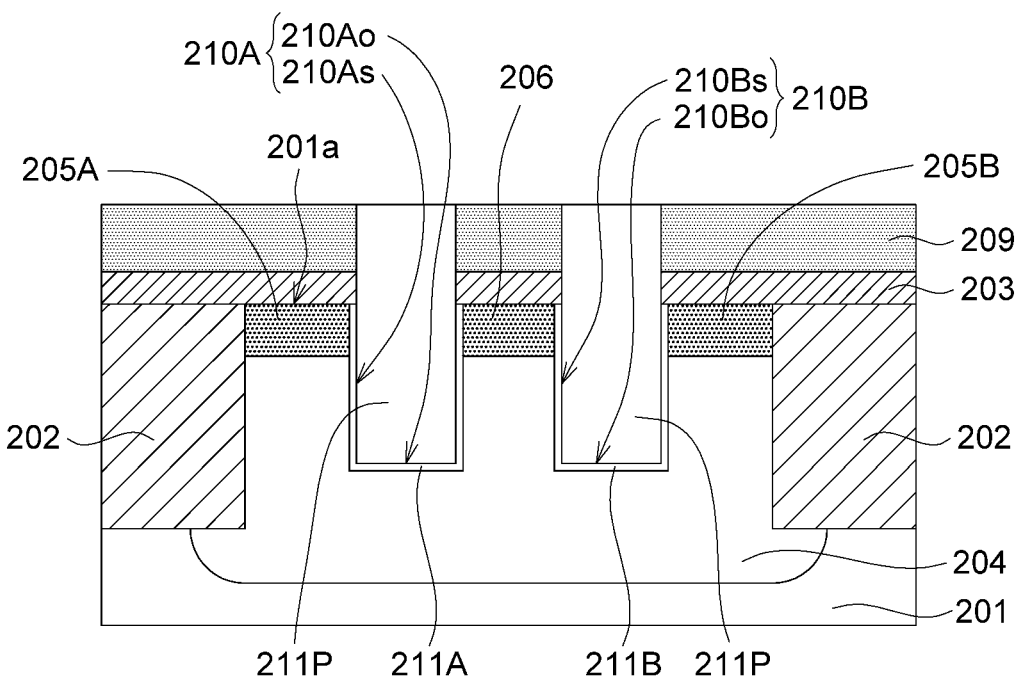
FIG. 2D(2)

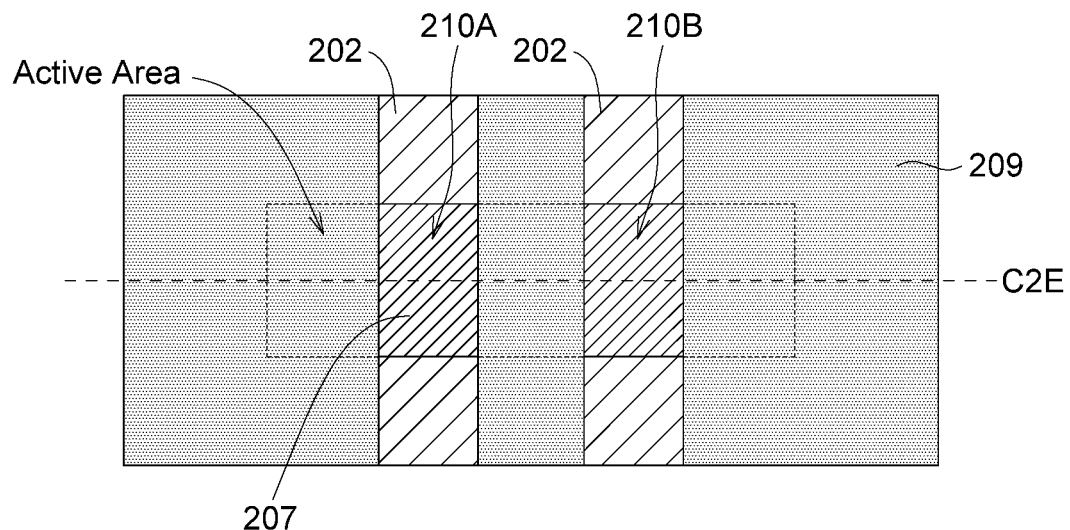
FIG. 2E(1)
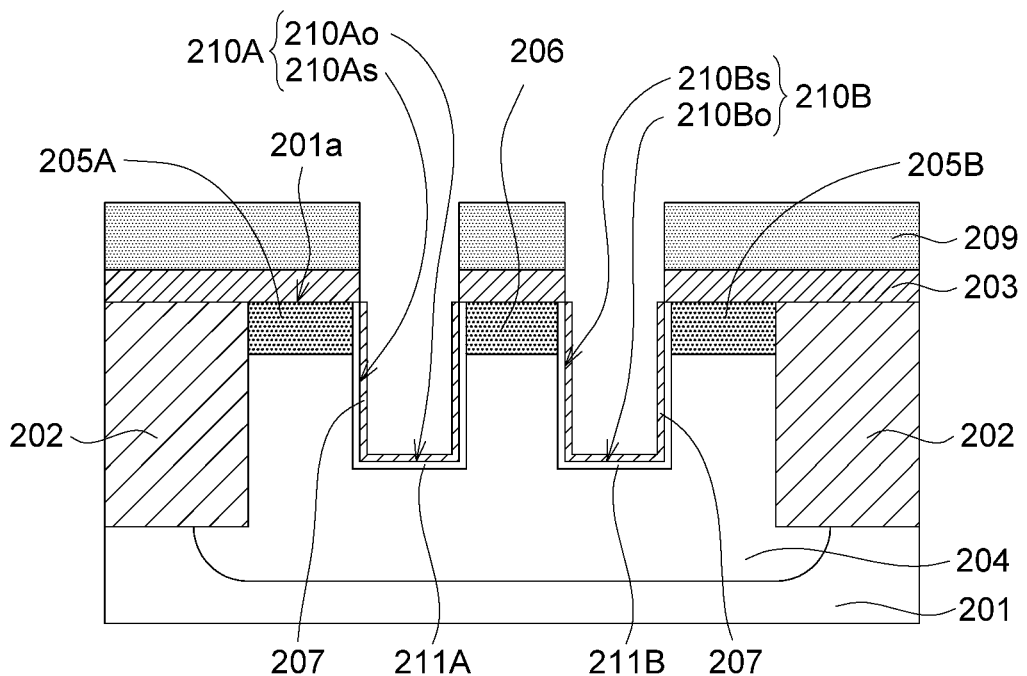
FIG. 2E(2)

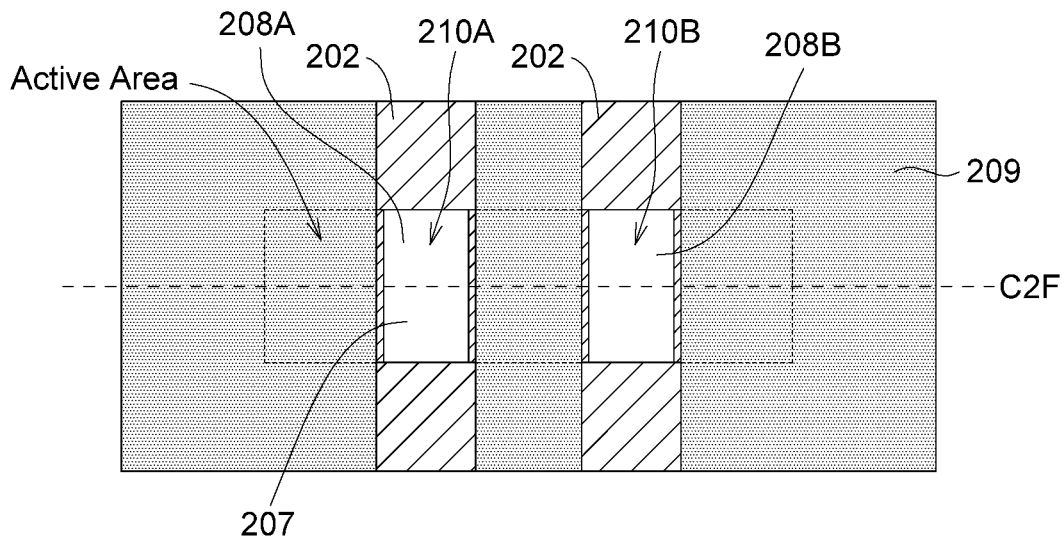
FIG. 2F(1)
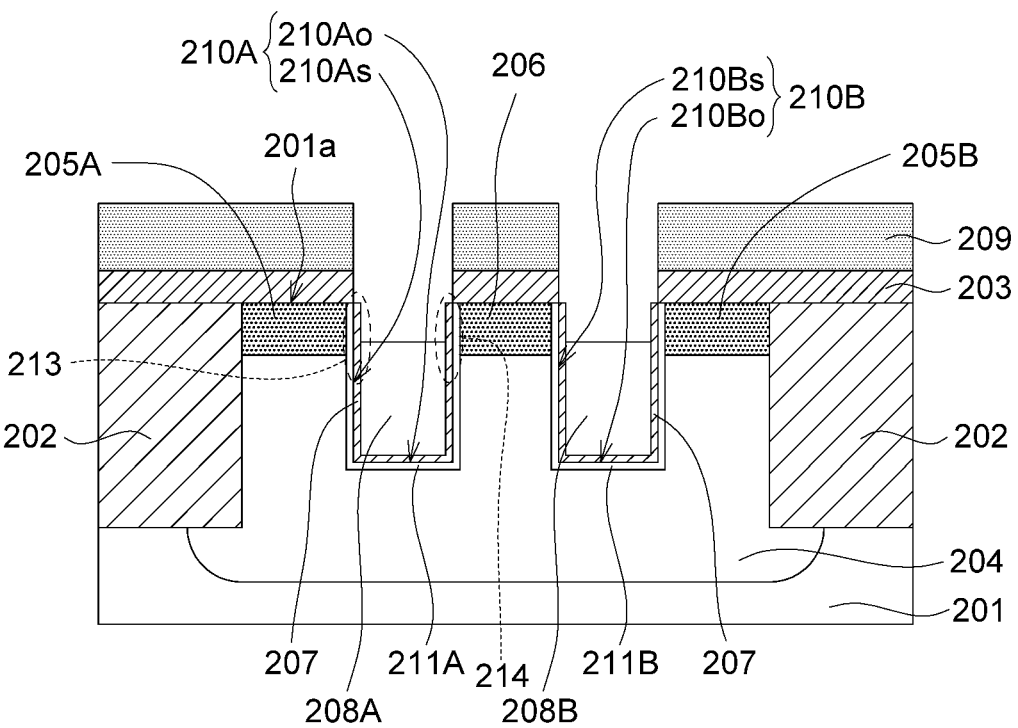
FIG. 2F(2)

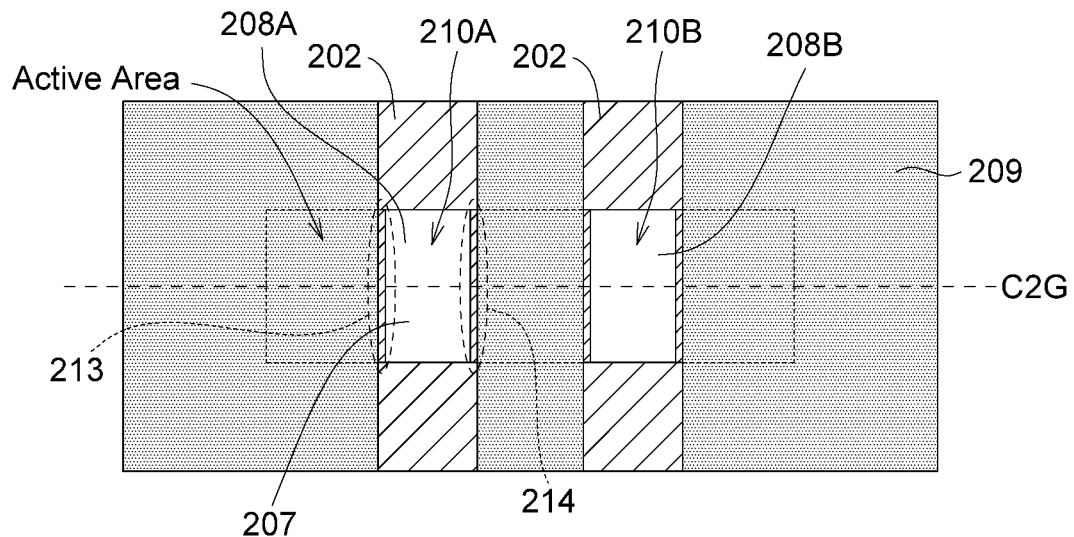
FIG. 2G(1)
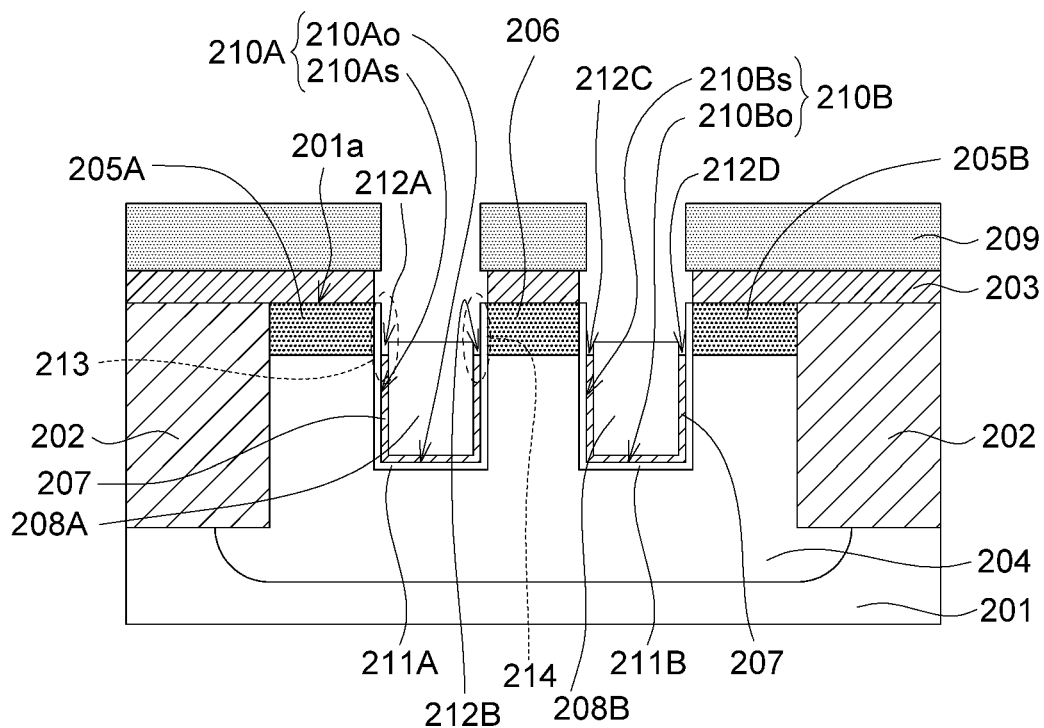
FIG. 2G(2)

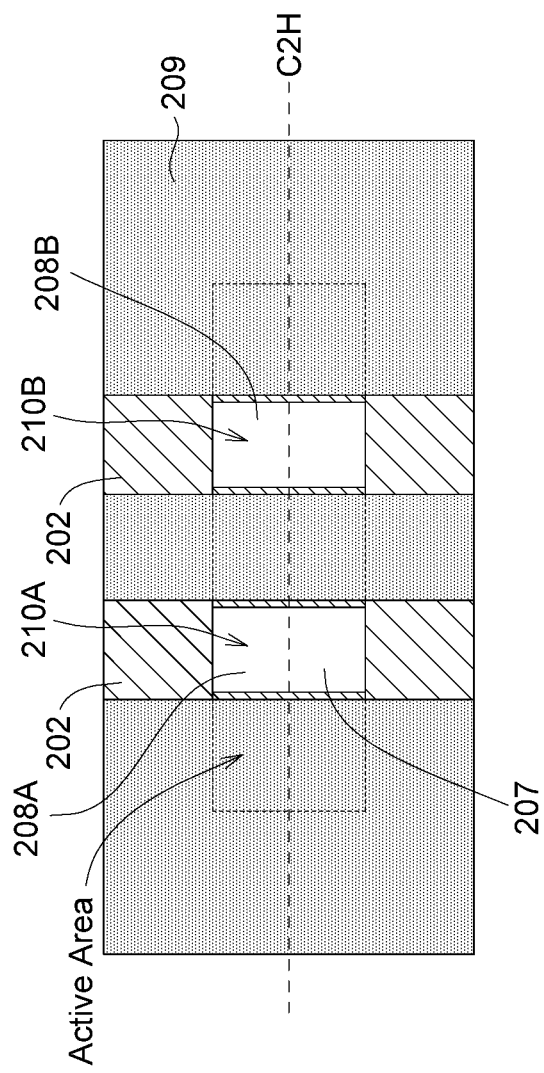

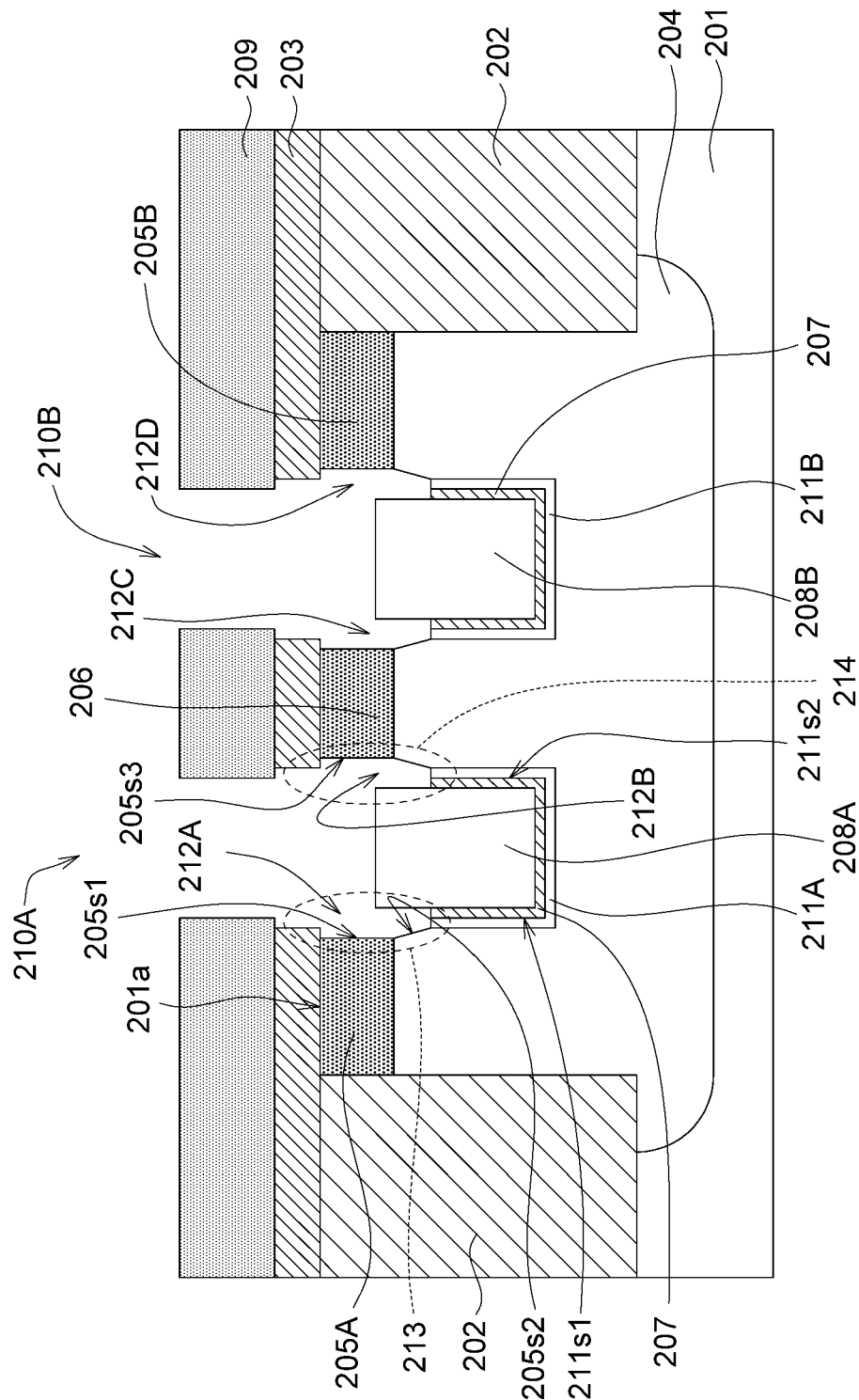
FIG. 2H(2)

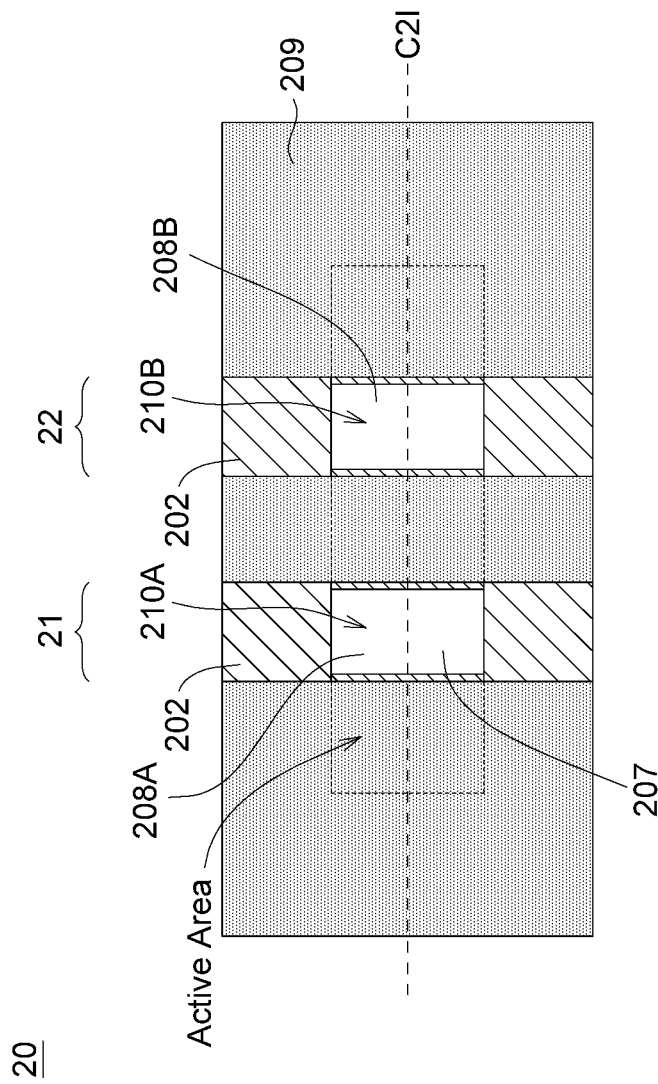

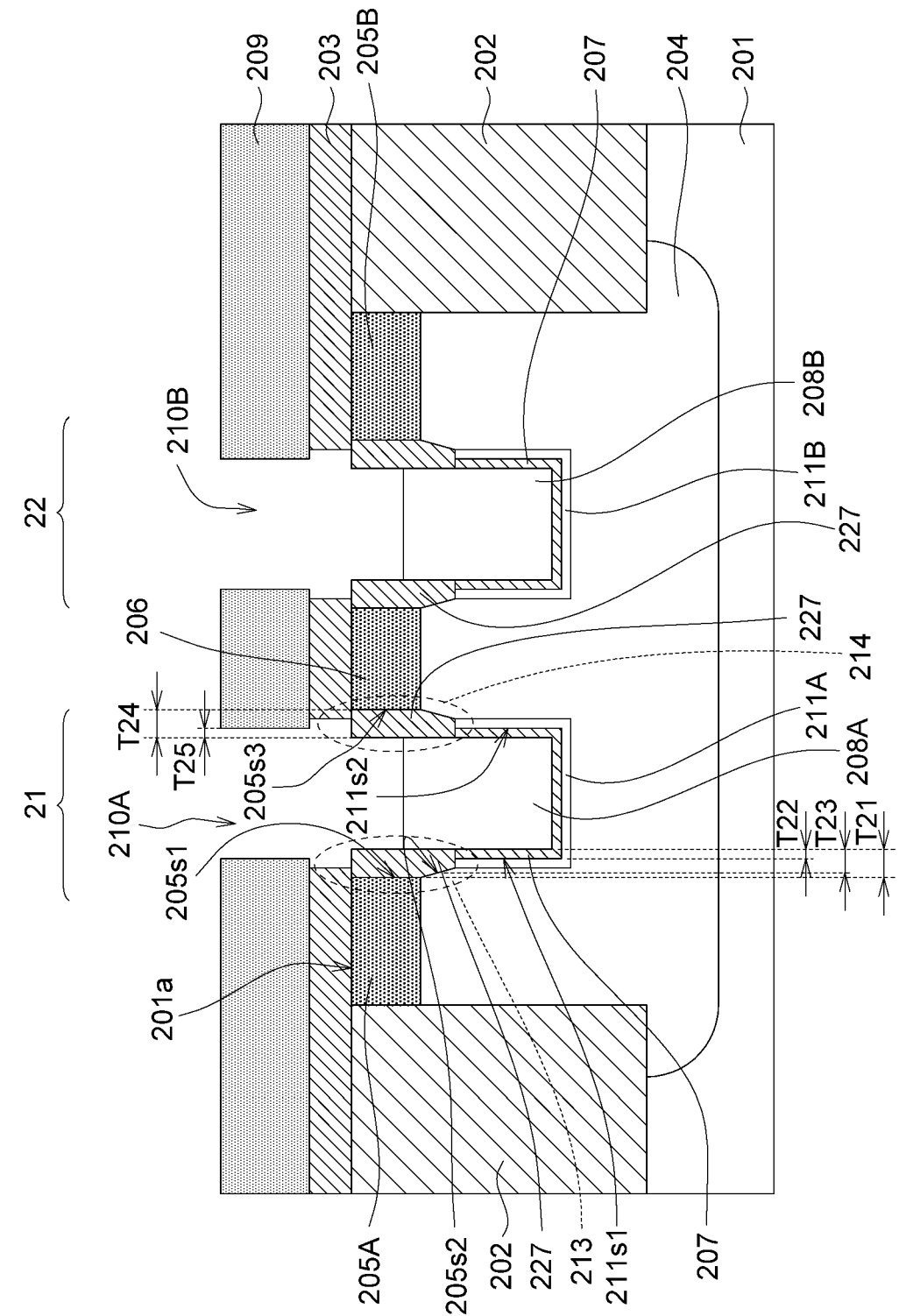
FIG. 2I(2)

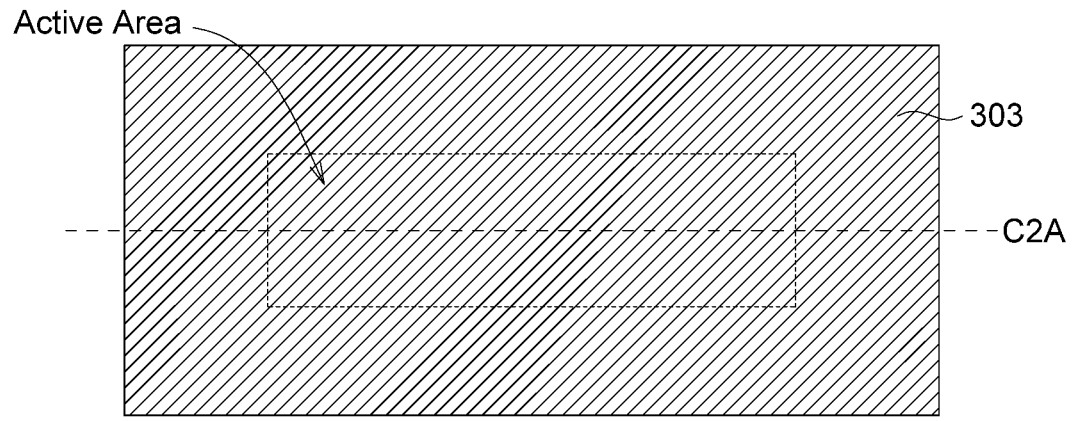
FIG. 3A(1)
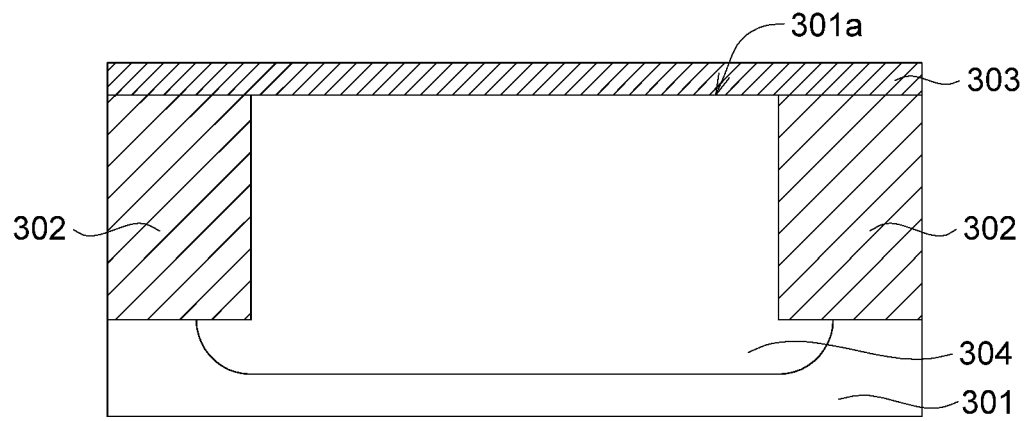
FIG. 3A(2)

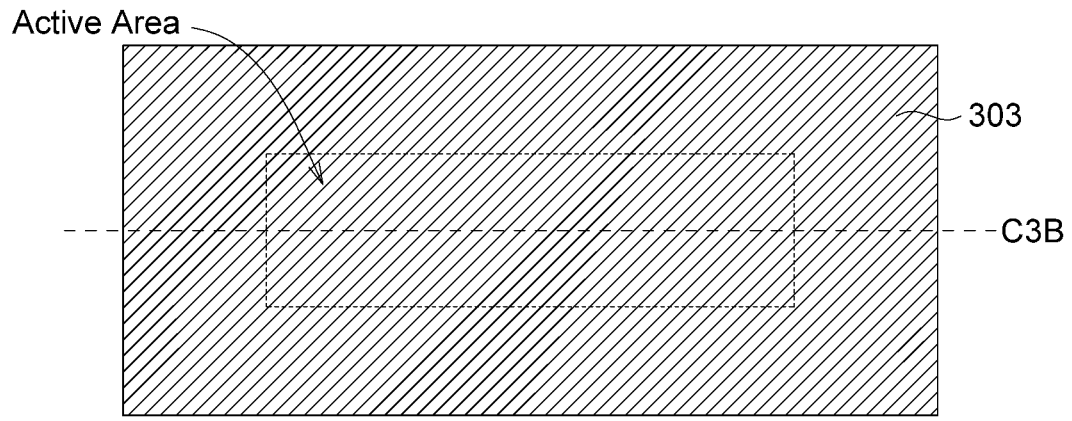
FIG. 3B(1)
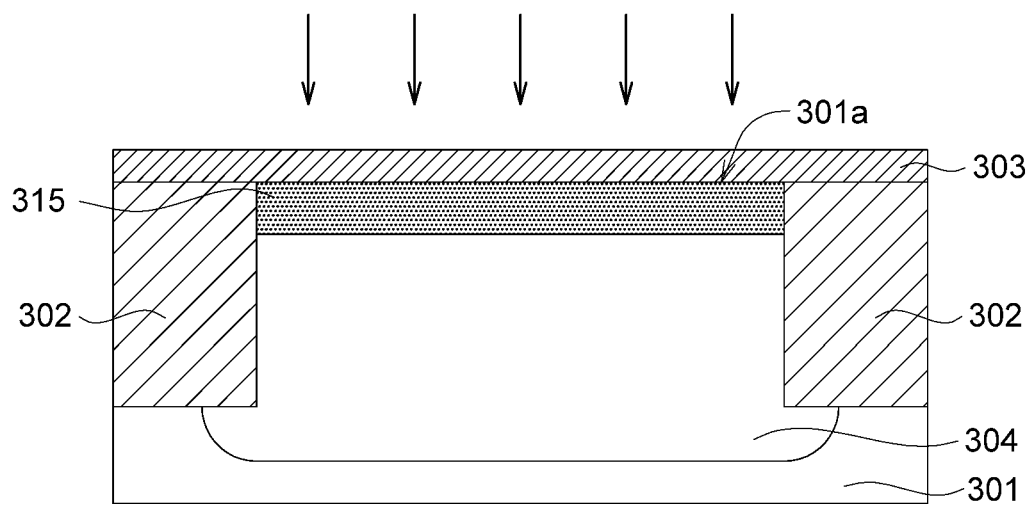
FIG. 3B(2)

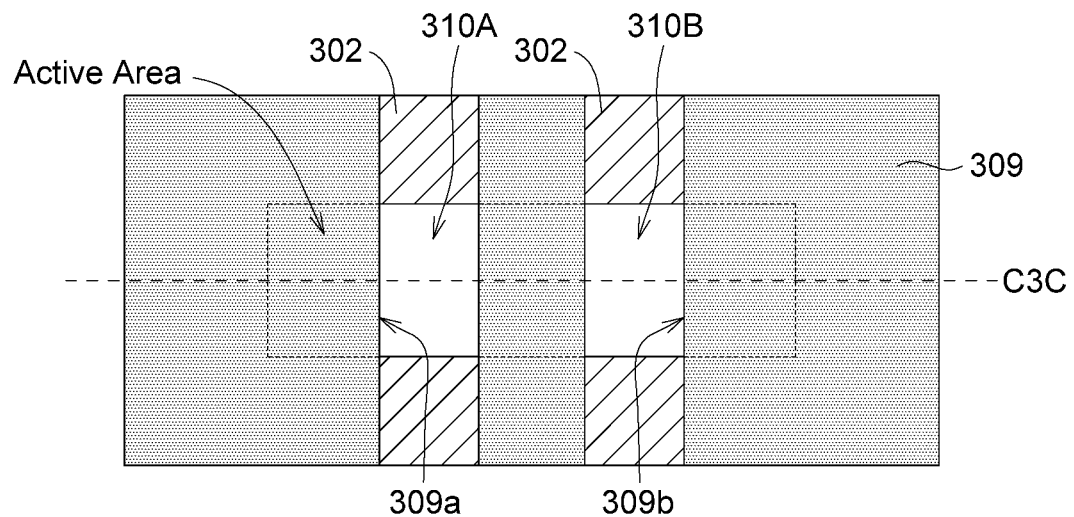
FIG. 3C(1)
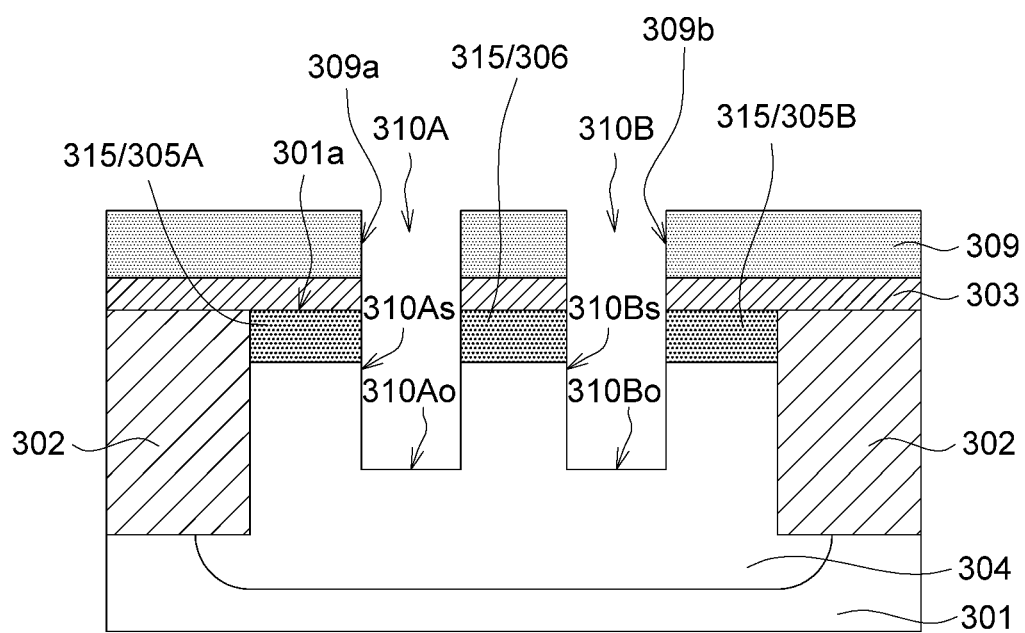
FIG. 3C(2)

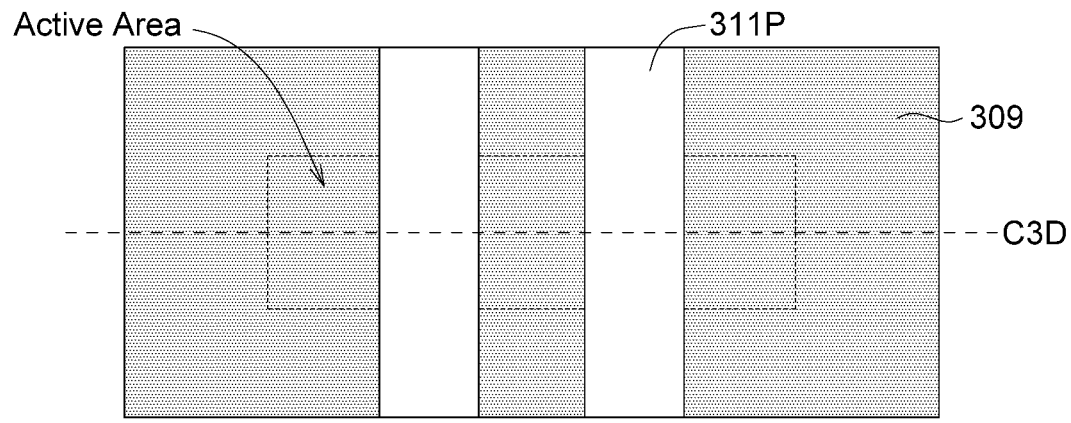
FIG. 3D(1)
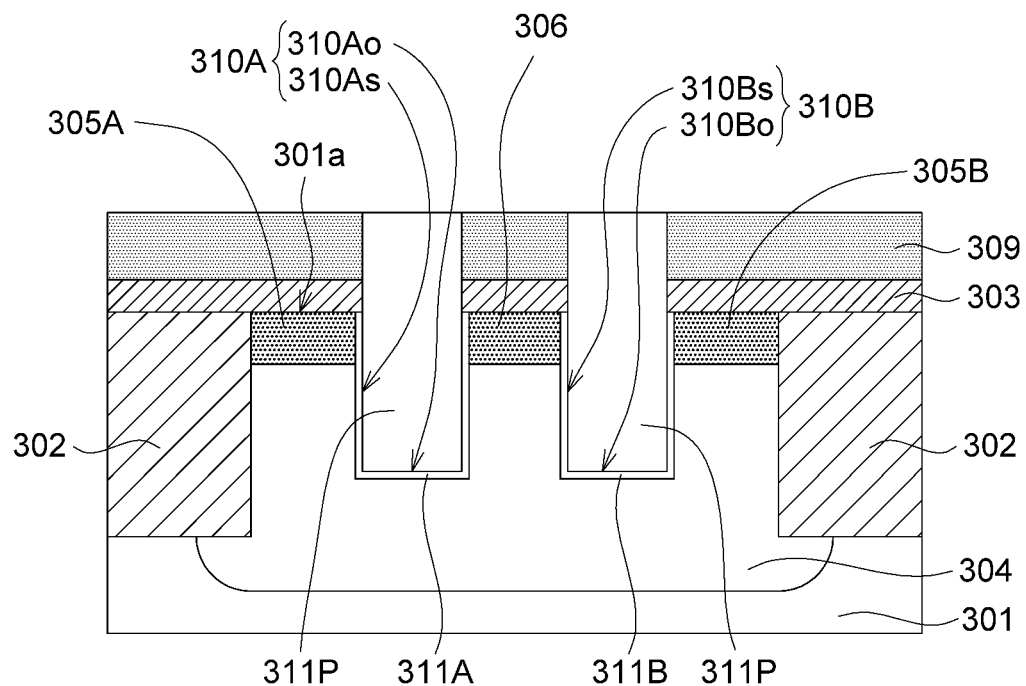
FIG. 3D(2)

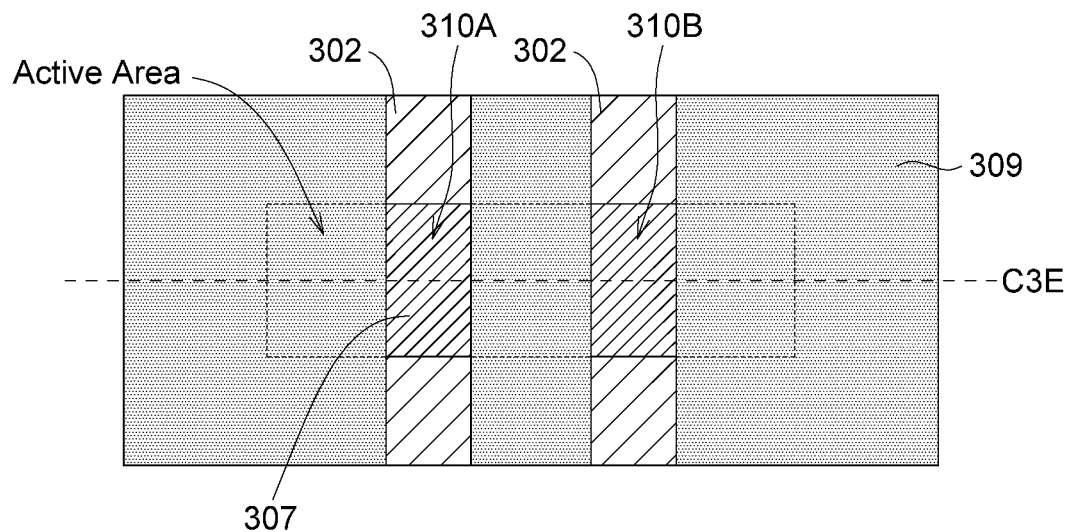
FIG. 3E(1)
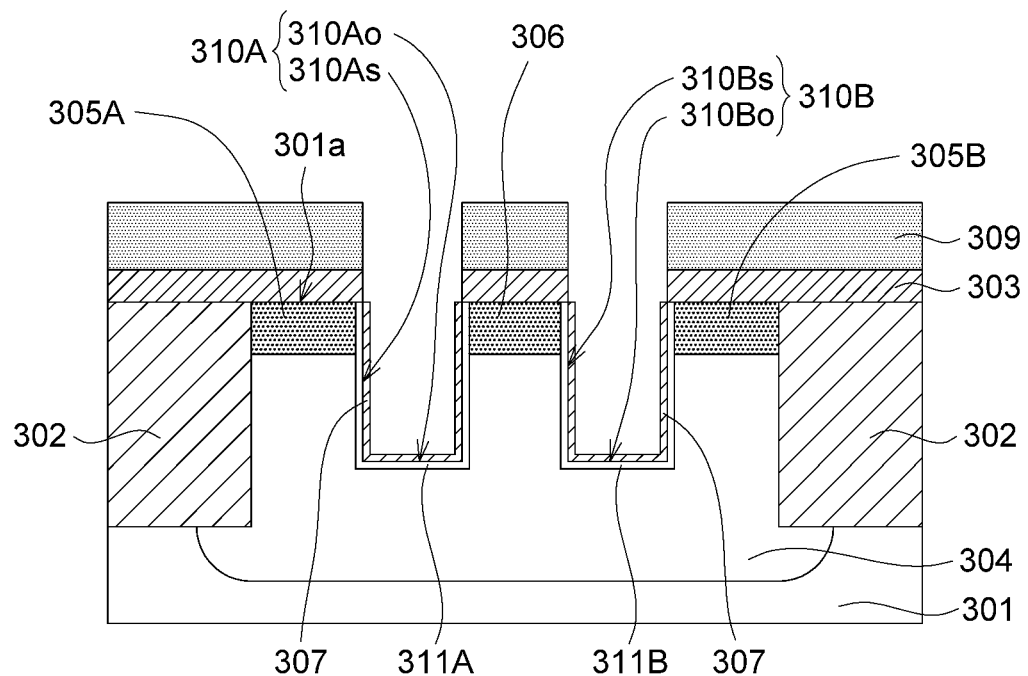
FIG. 3E(2)

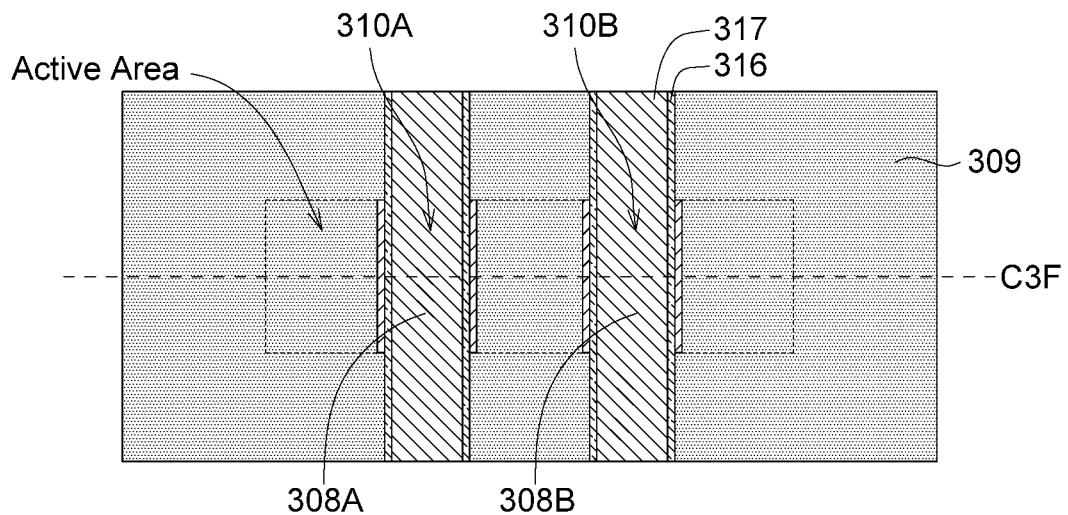
FIG. 3F(1)
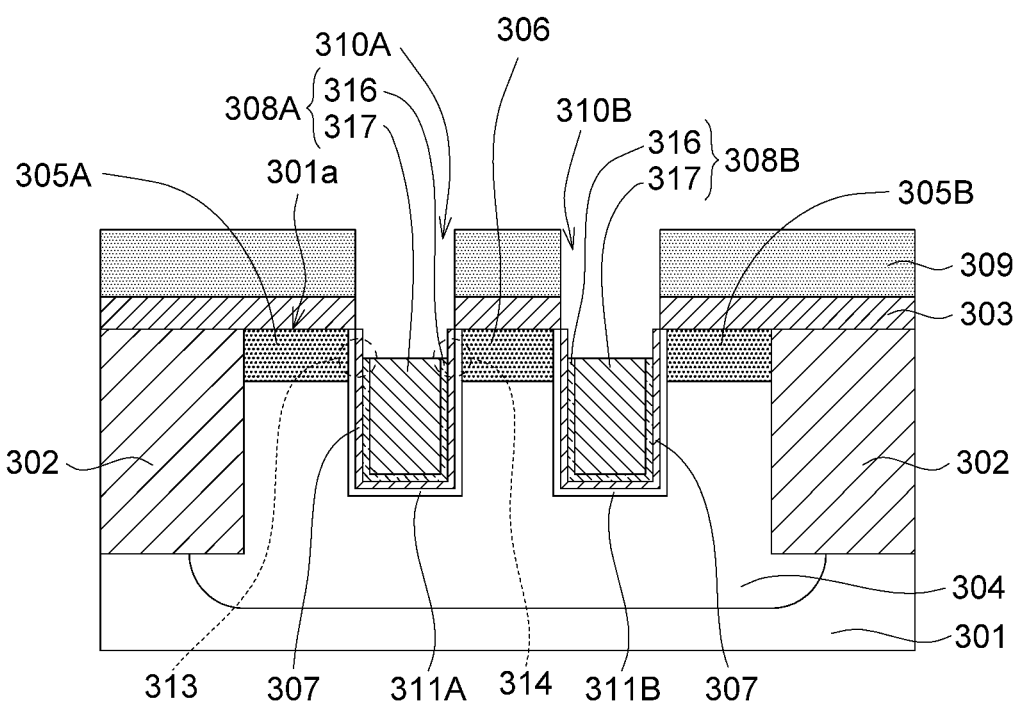
FIG. 3F(2)

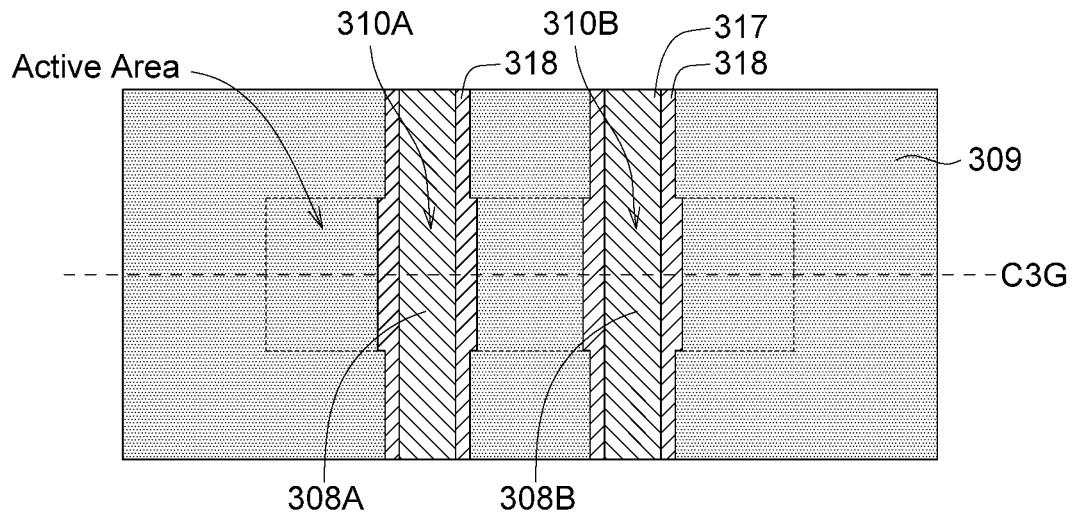
FIG. 3G(1)
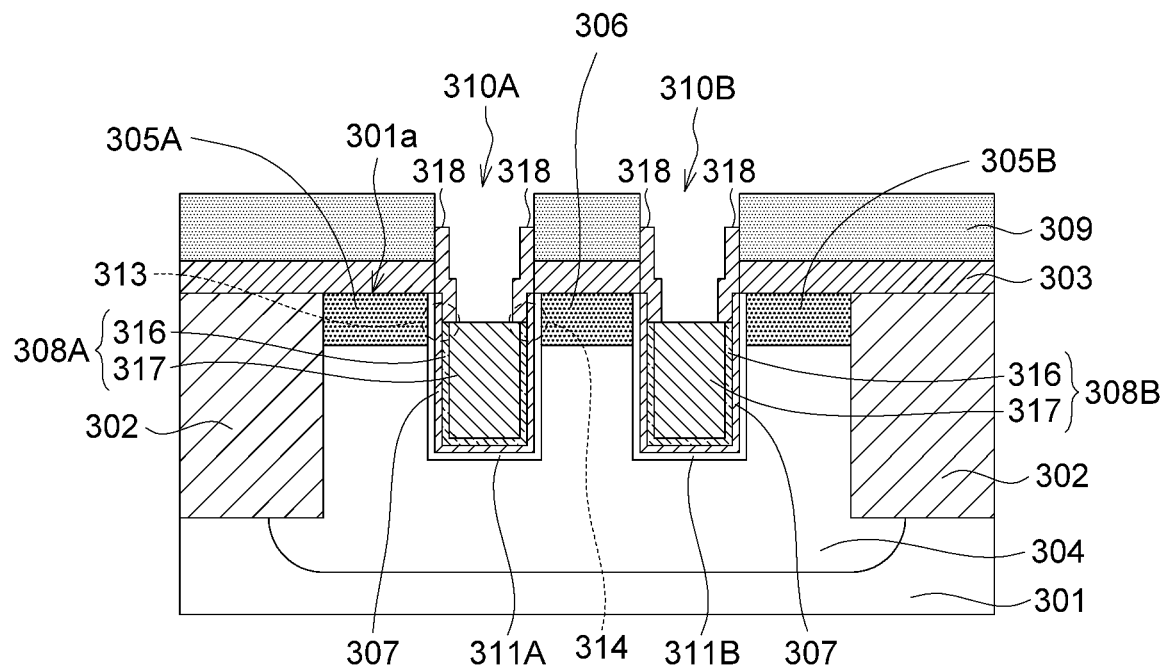
FIG. 3G(2)

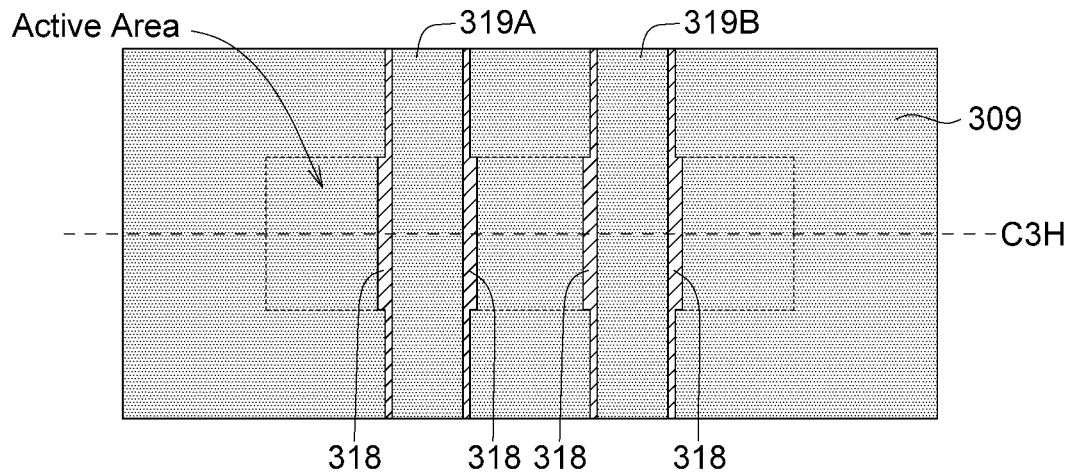
FIG. 3H(1)
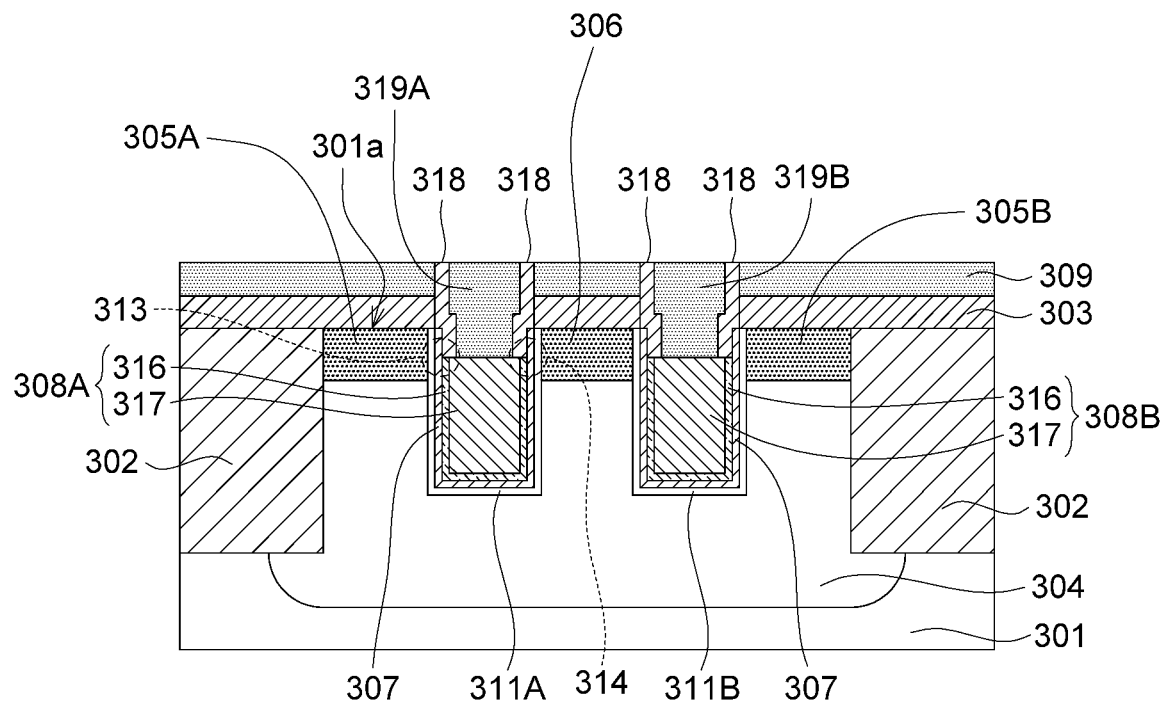
FIG. 3H(2)

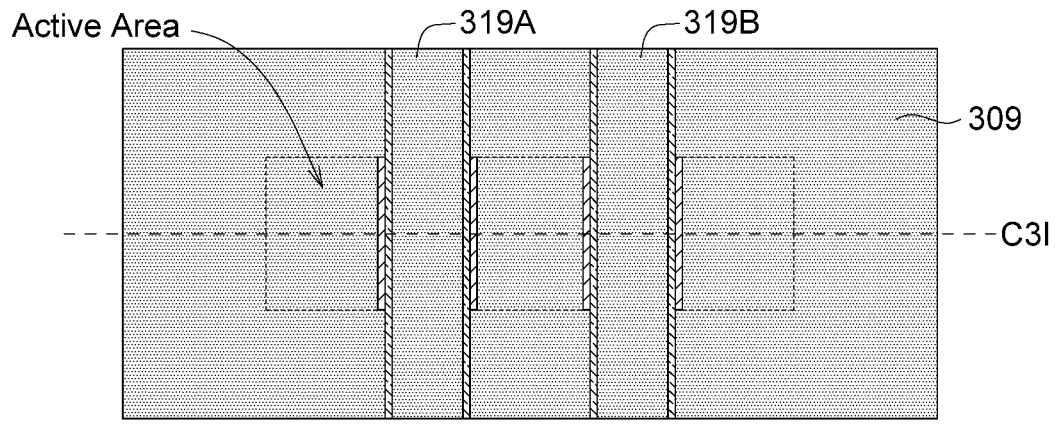
FIG. 3I(1)
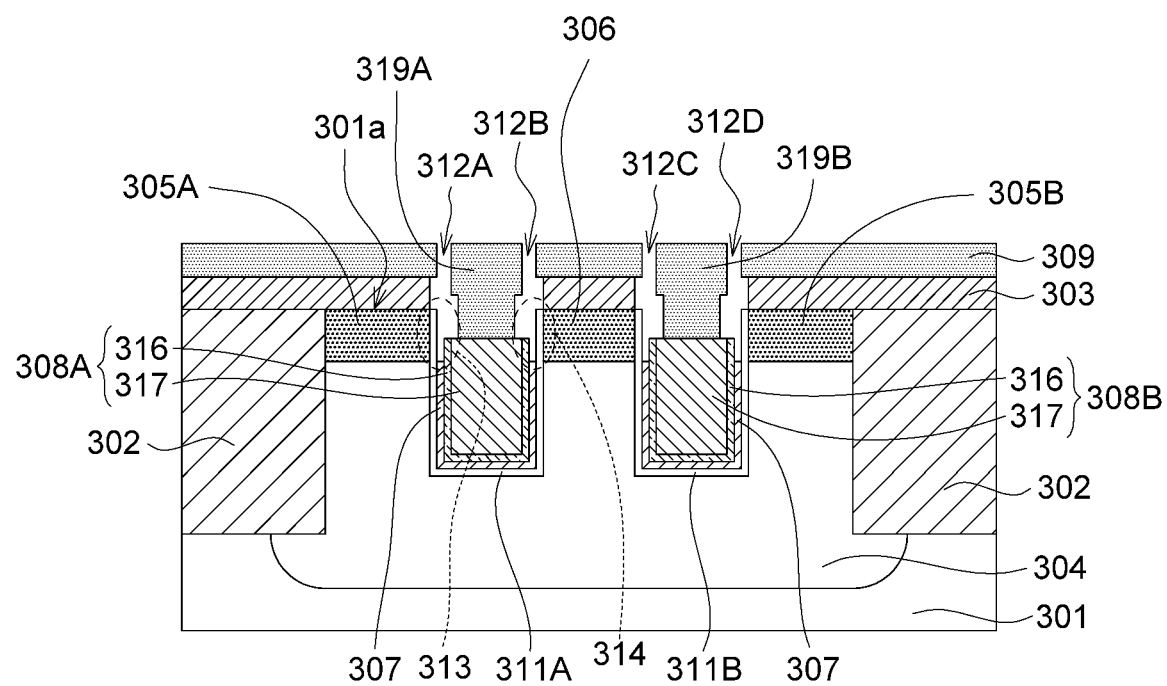
FIG. 3I(2)

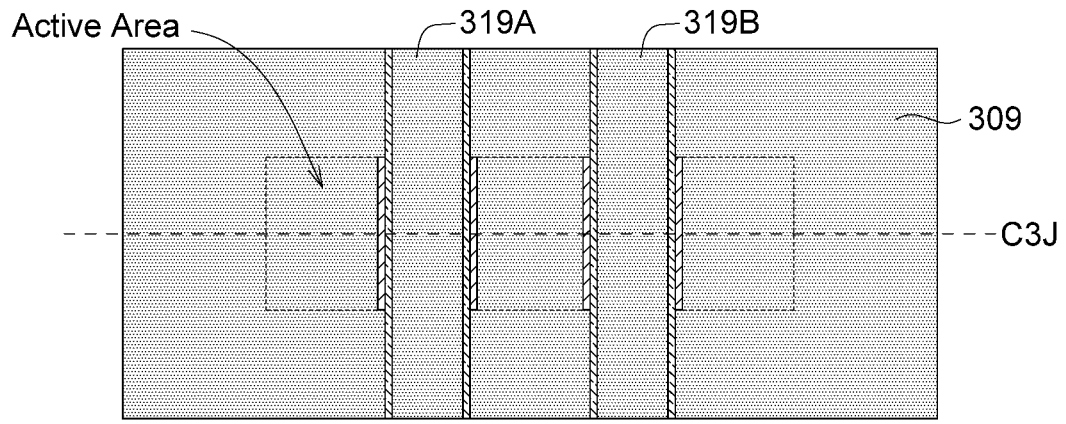
FIG. 3J(1)
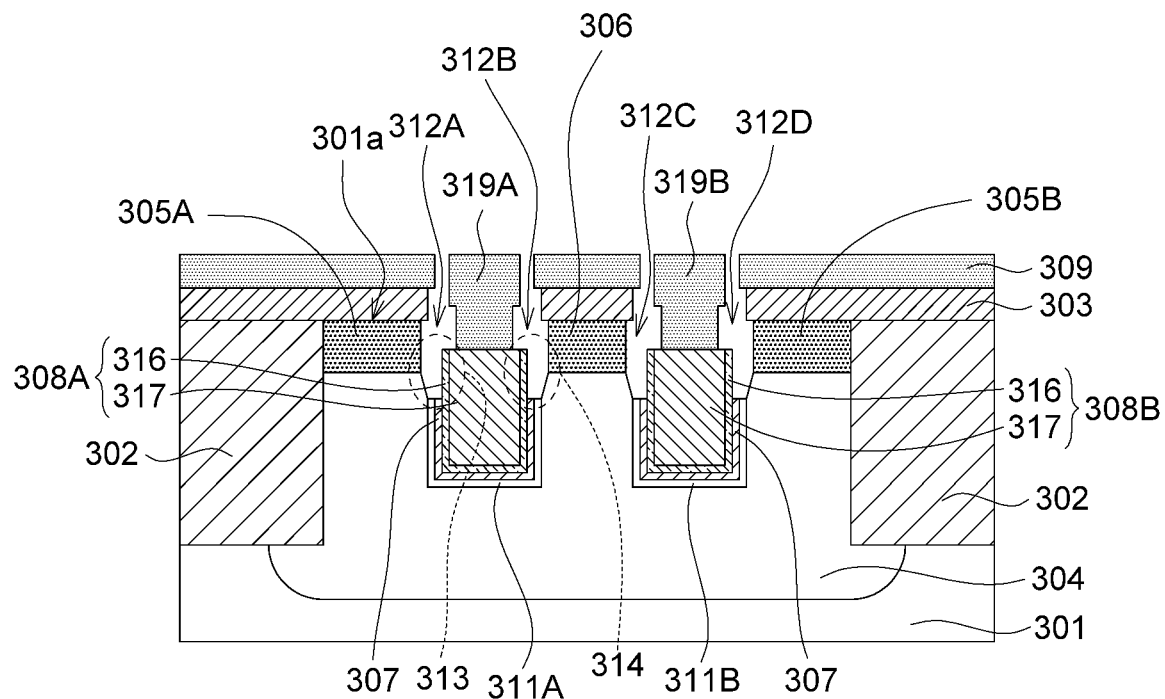
FIG. 3J(2)

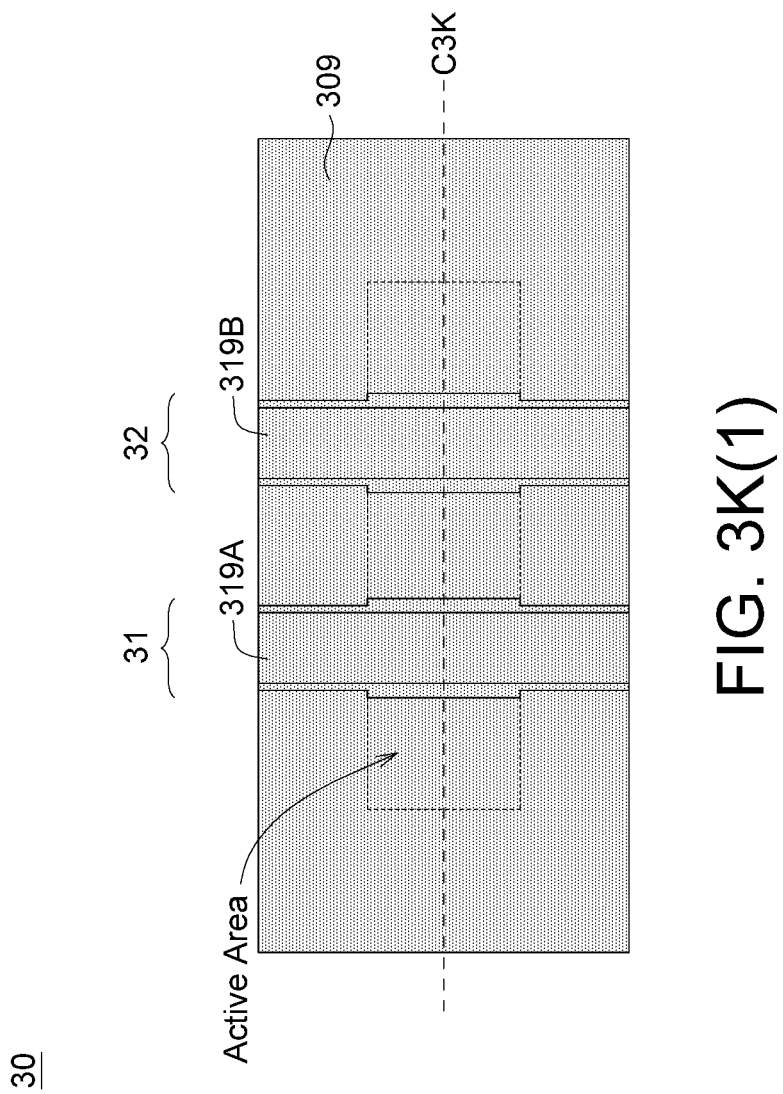

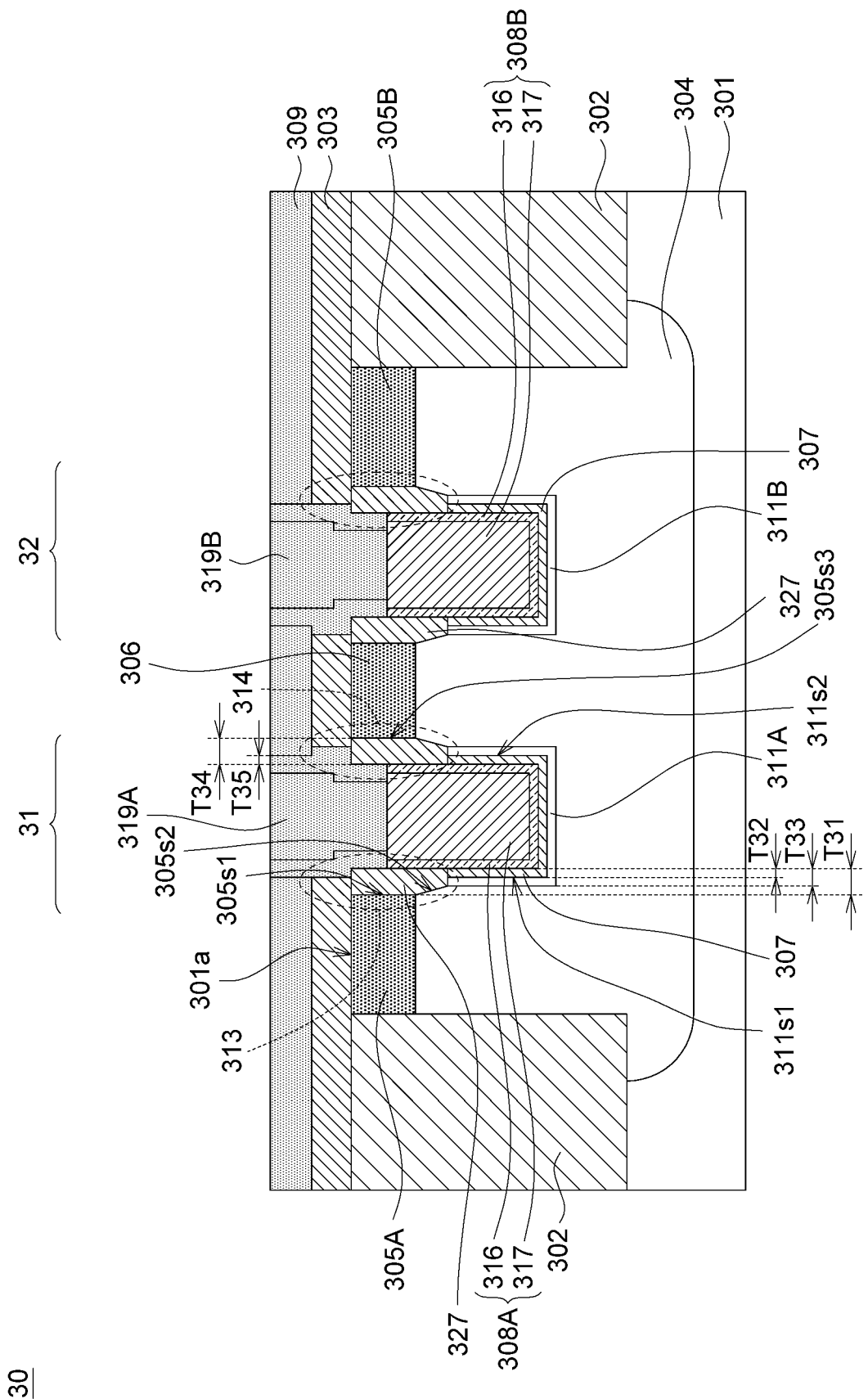
FIG. 3K(2)

TRANSISTOR STRUCTURE WITH INCREASED GATE DIELECTRIC THICKNESS BETWEEN GATE-TO-DRAIN OVERLAP REGION

This application claims the benefit of U.S. provisional application Ser. No. 63/195,743, filed Jun. 2, 2021, the subject matter of which is incorporated herein by reference.

BACKGROUND

Technical Field

The disclosure relates to a semiconductor device, and more particularly to a transistor structure to reduce Gate-Induced-Drain-Leakage (GIDL) by increasing localized gate dielectric thickness between gate-to-drain overlap region.

Description of Background

FIG. 1 is a cross section view illustrating a conventional transistor 100 applied in a buried word line DRAM cell 10. As shown in FIG. 1, part or all of the gate region 101 is located under an original substrate surface 110a of a P-substrate 110. The gate region 101 includes a gate conductive region, a dielectric gate cap 101b disposed over the gate conductive region and a gate oxide layer 105 being around or surrounding the gate conductive region. The gate conductive region could comprise either metal material 101a, such as, tungsten(W) and titanium nitride (TiN) 101c, or poly-silicon material (not shown). A terminal 102 (such as drain region) with N+ doped region 102a and a terminal 103 (such as source region) with a N+ doped region 103a are located on the left hand side and the right hand side of the gate 101. The terminal 102 and the terminal 103 could further include a lightly doped region (n_LDD) 102b and 103b respectively.

When such NMOS transistor (the transistor 100) is used as an access transistor of DRAM cell 10, the terminal 103 would be coupled to the storage capacitor of the DRAM cell 10 through a storage node (not shown) and the terminal 102 would be coupled to the bit line BL of the DRAM cell 10. Moreover, the channel region of the transistor (e.g., a NMOS transistor) 100 coupling between the terminal 102 and the terminal 103 will be around or surround the gate oxide layer 105.

However, such NMOS transistor (the transistor 100) suffers high leakage currents at an OFF state, such as more than one pico-Amperes per DRAM cell, which is not acceptable as it causes stored signal charges to leak away quickly, thus demanding a very short refresh time to restore the signals—otherwise the stored signals are lost. It is well known that there are many current leakage sources during OFF state, such as Gate-Induced-Drain-Leakage (GIDL) leakage.

For example, when a high voltage is applied to control the gate 101 with a thin gate oxide layer 105, a high electric field will be introduced to the gate-to drain overlap area and GIDL may be generated through band-to-band tunneling assisted by trapping states and thermal emission, and this may seriously impact the performance of the transistor 100.

In order to meet a very low OFF current target near femto-Amperes level per device, some transistor size parameters must be relaxed to unacceptable tolerances, which disobeys the scaling theory that requires shrinking the transistor dimensions in order to reduce the cell size for achieving Moore's Law economy. In an exaggerated example, for a 10-nanometer technology, the transistor gate length must be over 100 nanometers in order to reduce OFF current for meeting the fA/cell requirement, which is impractical.

Therefore, there is a need of providing an advanced transistor structure to obviate the drawbacks encountered from the prior art.

SUMMARY

One aspect of the present disclosure is to provide a transistor structure, wherein the transistor structure includes a gate conductive region, a gate dielectric region, a channel region and a drain region. The gate conductive region is below an original surface of a substrate. The gate dielectric region surrounds the gate conductive region and the channel region surrounds the gate dielectric region. The drain region is horizontally spaced apart from the gate conductive region, wherein the drain region includes a highly doped region; wherein the gate dielectric region includes a first dielectric portion and a second dielectric portion, the first dielectric portion is positioned between the gate conductive region and the highly doped region, and the second dielectric portion is positioned between the gate conductive region and the channel region (or the substrate in the event the channel region is in the substrate); wherein a horizontal thickness of the first dielectric portion is greater than that of the second dielectric portion.

In one embodiment of the present disclosure, the drain region further including a lightly doped region, the gate dielectric region further including a third dielectric portion positioned between the gate conductive region and the lightly doped region, wherein the horizontal thickness of the first dielectric portion is greater than that of the third dielectric portion.

In one embodiment of the present disclosure, a top surface of the gate conductive region is lower than that of the drain region.

Another aspect of the present disclosure is to provide a transistor structure, wherein the transistor structure includes a gate conductive region, a gate dielectric region, a channel region and a drain region. The gate conductive region is below an original surface of a substrate. The gate dielectric region surrounds the gate conductive region. The channel region surrounds the gate dielectric region. The drain region is spaced apart from the gate conductive region, wherein the drain region includes a highly doped region; wherein a side silicon surface of the highly doped region facing the gate conductive region is not aligned with a side silicon surface of the channel region which is abutted against the gate dielectric layer.

In one embodiment of the present disclosure, a horizontal distance between the gate conductive region and the side silicon surface of the highly doped region is larger than that between the gate conductive region and the side silicon surface of the channel region.

Yet another aspect of the present disclosure is to provide a manufacture method for a transistor structure, wherein the manufacture method includes steps as follows: A drain region, a first gate dielectric region and a gate conductive region are formed respectively, wherein the gate conductive region is surrounded by the first gate dielectric region, and a portion of the first gate dielectric region is between the gate conductive region and the drain region. A space between the drain region and the gate conductive region is formed. And, a second gate dielectric region is formed to fill in the space between the gate conductive region and the drain region, wherein a horizontal thickness of the second gate dielectric region is greater than that of the first gate dielectric region.

In one embodiment of the present disclosure, the forming of the space includes a step removing the part of the first gate dielectric region between the drain region and the gate conductive region.

In one embodiment of the present disclosure, the drain region is a highly doped region.

In one embodiment of the present disclosure, the forming of the space includes steps of removing the part of the first gate dielectric region between the gate conductive region and the drain region; and removing a portion of the drain region.

In one embodiment of the present disclosure, the drain region is a highly doped region.

This invention is to increase localized gate dielectric thickness at gate-to-drain overlap area to effectively reduce electric field on specific region to achieve GIDL reduction without impact device operation performance for the transistor. Through gate dielectric re-growth method to increase dielectric thickness of the gate dielectric layer (the second gate dielectric region) at gate-to-drain localize area for effectively lower down electric field to achieve GIDL reduction. The gate dielectric layer can be formed by pure $SiO_2$, or formed by $SiO_2$ mixed with N, H, F or the arbitrary combination thereof, or formed by $SiN/SiO_2$. The gate dielectric layer also can be formed by a CVD deposition.

Combined with additional anisotropic Si etch to the drain region (source region), the dielectric thickness at gate-to-drain localize area can be further increased to achieve GIDL reduction. The gate electrode (gate conductive region) can be formed by poly-silicon, poly-silicon mixed with silicide or W/TiN or W/TiN/Poly or Poly/W/TiN or the arbitrary combination thereof.

BRIEF DESCRIPTION OF THE DRAWINGS

The above objects and advantages of the present disclosure will become more readily apparent to those ordinarily skilled in the art after reviewing the following detailed description and accompanying drawings, in which:

FIG. 2A(1) is a top view illustrating a partial structure of the semiconductor substrate used for forming the NMOS transistors of the buried word line DRAM cell, according to one embodiment of the present disclosure.

FIG. 2A(2) is a cross-sectional view taken along the cutting line C2A as depicted in FIG. 2A(1).

FIG. 2B(1) is a top view illustrating a partial structure after the doped region is formed in the semiconductor substrate.

FIG. 2B(2) is a cross-sectional view taken along the cutting line C2B as depicted in FIG. 2B(1).

FIG. 2C(1) is a top view illustrating a partial structure after a plurality of gate recesses are formed in the semiconductor substrate.

FIG. 2C(2) is a cross-sectional view taken along the cutting line C2C as depicted in FIG. 2C(1).

FIG. 2D(1) is a top view illustrating a partial structure after the channel regions are respectively formed in the gate recesses.

FIG. 2D(2) is a cross-sectional view taken along the cutting line C2D as depicted in FIG. 2D(1).

FIG. 2E(1) is a top view illustrating a partial structure after the gate dielectric layer is formed in the gate recesses.

FIG. 2E(2) is a cross-sectional view taken along the cutting line C2E as depicted in FIG. 2E(1).

FIG. 2F(1) is a top view illustrating a partial structure after the gate conductive regions are respectively formed in the gate recesses.

FIG. 2F(2) is a cross-sectional view taken along the cutting line C2F as depicted in FIG. 2F(1).

FIG. 2G(1) is a top view illustrating a partial structure after the portions of the gate dielectric layer disposed at the gate-to-drain overlap area are removed.

FIG. 2G(2) is a cross-sectional view taken along the cutting line C2G as depicted in FIG. 2G(1).

FIG. 2H(1) is a top view illustrating a partial structure after the portion of the semiconductor substrate disposed at the gate-to-drain overlap area is removed.

FIG. 2H(2) is a cross-sectional view taken along the cutting line C2H as depicted in FIG. 2H(1).

FIG. 2I(1) is a top view illustrating a partial structure after the second gate dielectric region is formed.

FIG. 2I(2) is a cross-sectional view taken along the cutting line C2H as depicted in FIG. 2I(1).

FIG. 3A(1) is a top view illustrating a partial structure of the semiconductor substrate used for forming the NMOS transistors of the buried word line DRAM cell, according to one embodiment of the present disclosure.

FIG. 3A(2) is a cross-sectional view taken along the cutting line C3A as depicted in FIG. 3A(1).

FIG. 3B(1) is a top view illustrating a partial structure after the doped region is formed in the semiconductor substrate.

FIG. 3B(2) is a cross-sectional view taken along the cutting line C3B as depicted in FIG. 3B(1).

FIG. 3C(1) is a top view illustrating a partial structure after a plurality of gate recesses are formed in the semiconductor substrate.

FIG. 3C(2) is a cross-sectional view taken along the cutting line C3C as depicted in FIG. 3C(1).

FIG. 3D(1) is a top view illustrating a partial structure after the channel regions are respectively formed in the gate recesses.

FIG. 3D(2) is a cross-sectional view taken along the cutting line C3D as depicted in FIG. 3D(1).

FIG. 3E(1) is a top view illustrating a partial structure after the first gate dielectric layer is formed in the gate recesses.

FIG. 3E(2) is a cross-sectional view taken along the cutting line C3E as depicted in FIG. 3E(1).

FIG. 3F(1) is a top view illustrating a partial structure after the gate conductive regions are respectively formed in the gate recesses.

FIG. 3F(2) is a cross-sectional view taken along the cutting line C3F as depicted in FIG. 3F(1).

FIG. 3G(1) is a top view illustrating a partial structure after the thin oxide spacer is formed on the sidewalls of the gate recesses.

FIG. 3G(2) is a cross-sectional view taken along the cutting line C3G as depicted in FIG. 3G(1).

FIG. 3H(1) is a top view illustrating a partial structure after the nitride gate caps are respectively formed in the gate recesses.

FIG. 3H(2) is a cross-sectional view taken along the cutting line C3H as depicted in FIG. 3H(1).

FIG. 3I(1) is a top view illustrating a partial structure after the thin oxide spacer and the portions of the gate dielectric layer disposed at a gate-to-drain overlap area are removed.

FIG. 3I(2) is a cross-sectional view taken along the cutting line C3I as depicted in FIG. 3I(1).

FIG. 3J(1) is a top view illustrating a partial structure after the portion of the semiconductor substrate disposed at the gate-to-drain overlap area is removed.

FIG. 3J(2) is a cross-sectional view taken along the cutting line C3J as depicted in FIG. 3J(1).

FIG. 3K(1) is a top view illustrating a partial structure after the second gate dielectric region is formed.

FIG. 3K(2) is a cross-sectional view taken along the cutting line C3K as depicted in FIG. 3K(1).

DETAILED DESCRIPTION

Figure 1:
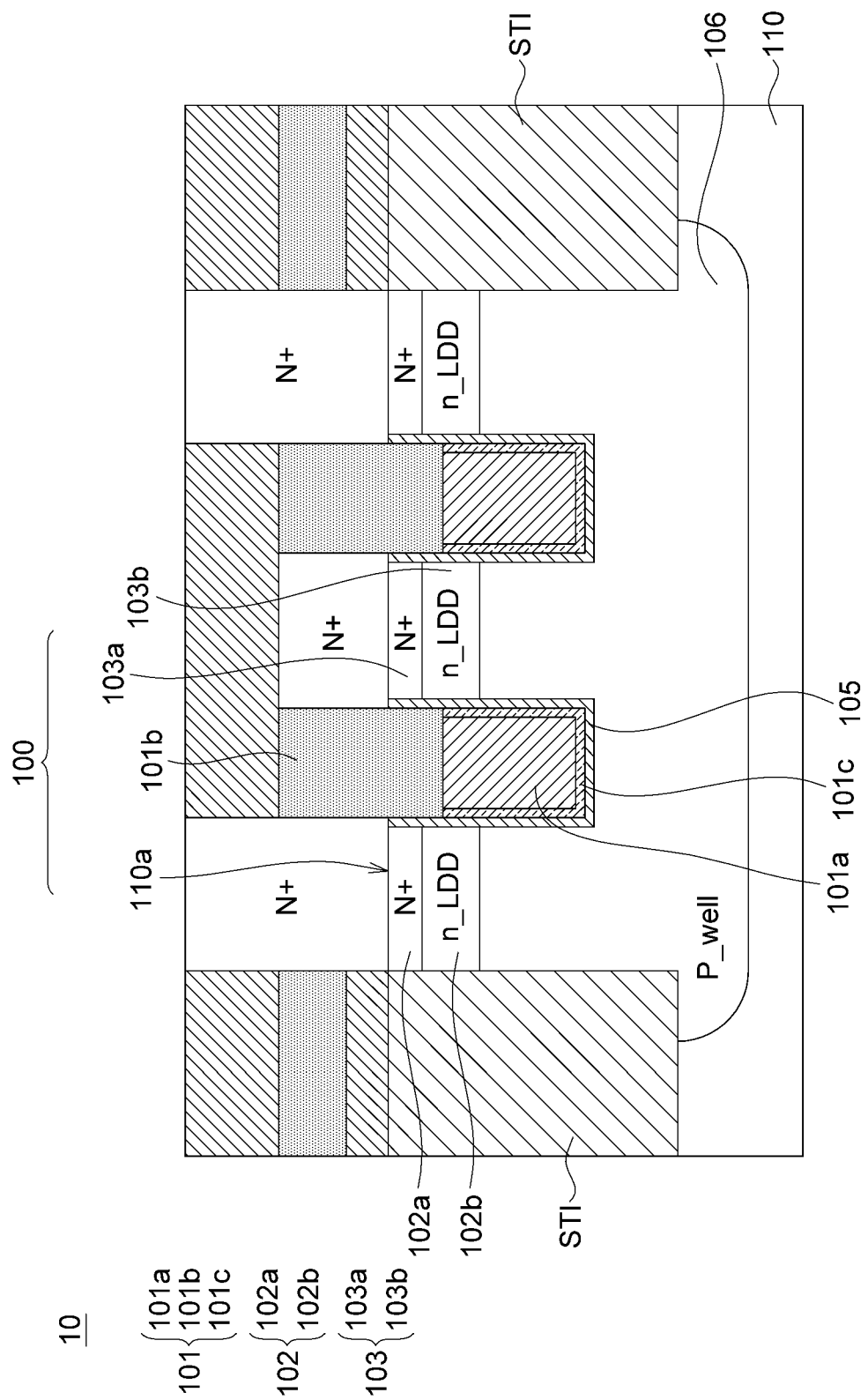
FIG. 1 is a cross section view illustrating a conventional access transistor applied in a buried word line DRAM cell.

The embodiments as illustrated below provide a transistor structure with decreased GIDL current, less threshold voltage variation and lower channel resistance. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

The following embodiments are described by forming a transistor structure for a semiconductor device. In some embodiments of the present disclosure, the transistor structure adopted as an example can be (but not limited to) an a NMOS transistor for used in a buried word line DRAM cell 20; a structure for a PMOS transistor (not shown) can be derived similarly except which has oppositely doped or formed materials in contrast to those of the NMOS transistor.

Embodiment 1

According to one embodiment of the present disclosure, the method for forming a transistor structure includes steps as follows:

Step S21: preparing a semiconductor substrate with an original surface;

Step S22: forming source and drain regions, a first gate dielectric layer and a gate conductive region respectively, wherein the gate conductive region is surrounded by the first gate dielectric layer, and a portion of the first gate dielectric layer is disposed at the gate-to-drain overlap area; wherein the step S22 includes steps as follows Step S221: forming a doped region in the semiconductor substrate;

Step S222: using a nitride hard mask layer to form at least one gate recess in the semiconductor substrate and dividing the doped region into the drain region and a source region;

Step S223: forming a channel region in the gate recess, wherein the channel layer is a doped layer within the semiconductor substrate (optionally);

Step S224: forming the first gate dielectric layer in the gate recess; and

Step S225: forming the gate conductive region in the gate recess and surrounded by the first gate dielectric layer;

Step S23: increasing space between the drain region and the gate conductive region at a gate-to-drain overlap area; wherein the step S23 includes steps as follows Step S231: removing the portion of the first gate dielectric layer disposed at a gate-to-drain overlap area; and Step S232: removing portions of the drain region (or the gate conductive region) such that the space between the drain region and the gate conductive region at a gate-to-drain overlap area is increased; and Step S24: forming a second gate dielectric region to fill in the increased gap between the gate conductive region and the drain region, wherein a horizontal thickness of the second gate dielectric region is greater than that of the first gate dielectric layer; and forming SiN to fill the remaining spaces of the gate recesses.

Referring to Step S21: preparing a semiconductor substrate 201 with an original surface 201a. FIG. 2A(1) is a top view illustrating a partial structure of the semiconductor substrate 201 used for forming the NMOS transistor, and FIG. 2A(2) is a cross-sectional view taken along the cutting line C2A as depicted in FIG. 2A(1).

In the present embodiment, the semiconductor substrate 201 could include a silicon layer, such as a single crystal silicon layer, a poly-silicon layer or an amorphous silicon layer. As shown in FIGS. 2A(1) and 2A(2), at least one shallow trench isolator (STI) 202 is then formed in the semiconductor substrate 201 to define an active area for forming the NMOS transistors 21 and 22; a pad oxide layer 203 is formed on the STI 202 and the original surface 201a of the semiconductor substrate 201. The pad oxide layer 203 may include silicon oxide, silicon oxynitride or the combination thereof. The active area is surrounded by the STI 202 and in the p-well 204.

Referring to Step S22: forming drain region/source regions, a first gate dielectric layer and a gate conductive region respectively, wherein the gate conductive region is surrounded by the first gate dielectric layer; and a portion of the first gate dielectric layer is disposed at the gate-to-drain overlap area. The step S22 includes sub-steps S221-S225 described as follows:

Referring to Step S221: forming a doped region 215 in the semiconductor substrate 201. FIG. 2B(1) is a top view illustrating a partial structure after the doped region 215 is formed in the semiconductor substrate 201. FIG. 2B(2) is a cross-sectional view taken along the cutting line C2B as depicted in FIG. 2B(1).

In some embodiments of the present disclosure, the forming of the doped region 215 includes performing at least one ion implantation process to drive a plurality of dopants into the semiconductor substrate 201. In the present disclosure, the doped region 215 includes a highly doped (N+) region and a lightly doped region (n_LDD).

Referring to Step S222: using a patterned nitride hard mask layer 209 to form at least one gate recess (such as, the gate recesses 210A and 210B) in the semiconductor substrate 201 and dividing the doped region 215 into at least one drain region (such as, the drain regions 205A and 205B) and one at least one source region (such as, the source region 206), wherein FIG. 2C(1) is a top view illustrating a partial structure after the gate recesses 210A and 210B are formed in the semiconductor substrate 201, and FIG. 2C(2) is a cross-sectional view taken along the cutting line C2C as depicted in FIG. 2C(1).

In Step S222, a patterned nitride hard mask layer 209 having at least one opening (such as, the openings 209a and 209b) is formed on the pad oxide layer 203, and at least one etching process using the patterned nitride hard mask layer 209 as an etching mask is performed to remove portions of the pad oxide layer 203 and portions of the semiconductor substrate 201, so as to define the gate recesses 210A and 210B within the active area and penetrating the doped region 215 and to define the drain regions 205A and 205B and the source region 206 respectively adjacent to the gate recesses 210A and 210B.

In the present embodiment, alternatively, a single photoresist patterning (etching) process may be performed to remove portions of the nitride hard mask layer 209, portions of the pad oxide layer 203 and portions of the semiconductor substrate 201 to define the gate recesses 210A and 210B in the semiconductor substrate 201, as well as to define the drain regions 205A and 205B and the source region 206 respectively adjacent to the gate recesses 210A and 210.

Referring to Step S223: forming a channel region (such as the channel region 211A) in the gate recess (such as, the gate recess 210A), wherein the channel layer 211A is a doped layer formed within the semiconductor substrate 201. FIG. 2D(1) is a top view illustrating a partial structure after the channel regions 211A and 211B are respectively formed in the gate recesses 210A and 210B. FIG. 2D(2) is a cross-sectional view taken along the cutting line C2D as depicted in FIG. 2D(1).

In the present embodiment, the forming of the channel regions 211A and 211B includes steps as follows: Firstly, a p-type doped polysilicon plug 211P is formed to fill the gate recesses 210A and 210B, and a thermal annealing process is then performed to drive the p-type dopants (e.g, Boron) originally doped in the p-type doped polysilicon plug 211P penetrating through the bottom wall 210Ao and 210Bo as well as the sidewalls 210As and 210Bs of the gate recesses 210A and 210B, so as to form a doped layer (having two separated portions respectively disposed in the gate recesses 210A and 210B and serving as the channel regions 211A and 211B) within the semiconductor substrate 201.

In an alternative embodiment, the forming of the channel regions 211A and 211B includes performing a process selective growth process (e.g., a SEG process or an ALD process) to respectively form a p-type doped polysilicon layer or a silicon-germanium ($Si_{1-x}Ge_x$) layer (not shown) on the bottom wall 210Ao and 210Bo as well as on the sidewalls 210As and 210Bs of the gate recesses 210A and 210B. Wherein each of the channel region 211A and 211B can be a deposited layer (not shown) extending into the gate recess 210A or the gate recess 210B from the semiconductor substrate 201 independently.

Referring to Step S224: forming a gate dielectric layer (also referred to as the first gate dielectric layer) 207 in the gate recess 210A and 210B, wherein FIG. 2E(1) is a top view illustrating a partial structure after the first gate dielectric layer 207 is formed in the gate recesses 210A and 210B, and FIG. 2E(2) is a cross-sectional view taken along the cutting line C2E as depicted in FIG. 2E(1).

In the present embodiment, the forming of the first gate dielectric layer 207 includes steps as follows: Firstly, the p-type doped polysilicon plug 211P filled in the gate recesses 210A and 210B is removed by an etching process; and then a thermal oxidation process is performed to growth thermal gate dielectric material on the bottom wall 210Ao and 210Bo as well as the sidewalls 210As and 210Bs of the gate recesses 210A and 210B.

Alternatively, in some other embodiments, the first gate dielectric layer 207 can be a dielectric layer (e.g., including silicon dioxide or high-k dielectric material) formed on the bottom wall 210Ao and 210Bo as well as the sidewalls 210As and 210Bs of the gate recesses 210A and 210B by a deposition process (e.g., a low-pressure chemical vapor deposition (LPCVD)).

Referring to Step S225: forming a gate conductive region (such as the gate conductive regions 208A and 210B) in the gate recess (such as gate recesses 210A and 210B) and surrounded by the first gate dielectric layer 207, wherein FIG. 2F(1) is a top view illustrating a partial structure after the gate conductive regions 208A and 208B are respectively formed in the gate recesses 210A and 210B, and FIG. 2F(2) is a cross-sectional view taken along the cutting line C2F as depicted in FIG. 2F(1).

In the present embodiment, the forming of the gate conductive regions 208A and 208B includes steps as follows: Firstly, a silicon deposition process (e.g., a LPCVD process) is performed to form poly-silicon, poly-silicon mixed with silicide (including W/TiN or W/TiN/Poly or Poly/W/TiN or the arbitrary combination thereof) or amorphous silicon (a-Si) material on the first gate dielectric layer 207 and fill the gate recesses 210A and 210B. Subsequently, an etching back process is performed to remove the portions of the polysilicon or a-Si material disposed in the top of the gate recesses 210A and 210B, so as to form the gate conductive regions 208A and 208B in the gate recesses 210A and 210B respectively.

Wherein, the top surface of the gate conductive regions 208A and 208B could be below the original substrate surface 201a. However, the top surface of the gate conductive regions 208A and 208B is lower than the top surface of the drain regions 205A and 205B, but higher than the bottom surface of the drain regions 205A and 205B, and thus there is a gate-to-drain overlap area 213 between the drain region 205A and the gate conductive region 208A; there is another gate-to-drain overlap area between the drain region 205B and the gate conductive region 208B; there is a gate-to-source overlap area 214 between the source region 206 and the gate conductive region 208A; and there is another gate-to-source overlap area between the source region 206 and the gate conductive region 208B.

Meanwhile, a portion of the first gate dielectric layer 207 is disposed at the overlap area between the gate conductive regions 208A and the drain region 205A (or at a gate-to-drain overlap area); a portion of the first gate dielectric layer 207 is disposed at the overlap area between the gate conductive regions 208A and the source region 206 (or at a gate-to-source overlap area), etc.

Referring to Step S23: increasing gap between the drain region and the gate conductive region at the gate-to-drain overlap area. The forming of the space includes sub-steps S231-S232 described as follows:

Referring to Step S231: removing the portions of the first gate dielectric layer 207 disposed at a gate-to-drain overlap area 213 between the gate conductive regions 208A and the drain region 205, wherein FIG. 2G(1) is a top view illustrating a partial structure after the portions of the first gate dielectric layer 207 disposed at the gate-to-drain overlap area 213 are removed, and FIG. 2G(2) is a cross-sectional view taken along the cutting line C2G as depicted in FIG. 2G(1).

In the present embodiment, an etching process using a wet dip (including $H_4F$) is performed to remove the portions of the first gate dielectric layer 207 disposed at the gate-to-drain overlap areas 213 (at least including the area between the drain region 205A and the top of the gate conductive region 208A) and the portions of the first gate dielectric layer 207 disposed at the gate-to-source overlap area 214 (at least including the area between the source region 206 and the top of the gate conductive regions 208A). In some embodiments of the present disclosure, portions of the pad oxide layer 203 adjacent to the gate recesses 210A and 210B may be also removed by the etching process.

Whereby, side surfaces of the source region 206 and the drain regions 205A and 205B can be revealed. Meanwhile, several spaces (such as, the spaces 212A, 212B, 212C and 212D) can be respectively created between the drain region 205A and the gate conductive region 210A, between the drain region 205B and the gate conductive region 210B, between the source 206 and the gate conductive region 210A, and between the source 206 and the gate conductive region 210B.

Referring to Step S232: removing portions of the drain region (or the gate conductive region) in the semiconductor substrate 201 disposed at the gate-to-drain overlap area 213 (and at the gate-to-source overlap area 214), wherein FIG. 2H(1) is a top view illustrating a partial structure after the portion of the semiconductor substrate 201 disposed at the gate-to-drain overlap area 213 is removed, and FIG. 2H(2) is a cross-sectional view taken along the cutting line C2H as depicted in FIG. 2H(1). Alternatively, portion of the gate conductive region at the gate-to-drain overlap area be removed, just like the drain region, to increase the space between the gate conductive region and the drain region.

In the present embodiment, an etching process using a wet dip (e.g., $HNO_3$, HF and $CO_3COOH$) is performed to remove the portions of the drain region (and source region) in the semiconductor substrate 201, especially the portions of the semiconductor substrate 201 disposed at the gate-to-drain overlap area 213 and at the gate-to-source overlap area 214, so as to laterally enhance the volume of the spaces 212A, 212b, 212C and 212D.

In detailed, as shown in FIG. 2H(2), a side silicon surface 205s1 of the doped region 215 (or the remaining drain region 205A) facing the gate conductive regions 208A is not aligned with a side silicon surface 211s1 of the channel region 211A which is abutted against the first gate dielectric layer 207. The horizontal distance between the gate conductive regions 208A and the side silicon surface 205s1 of the remaining drain region 205A can be larger than that between the gate conductive regions 208A and the side silicon surface 211s1 of the channel region 211A.

The horizontal distance of the space 212b between the source region 206 and the gate conductive region 208A, the horizontal distance of the space 212C between the source 206 and the gate conductive region 208B and the horizontal distance of the space 212D between the drain 205B and the gate conductive region 208B can be also laterally enhanced or increased by the similar way.

Referring to Step S24: forming a second gate dielectric region 227 to fill in the space (increased gap) 212A between the gate conductive region 208A and the drain region 205A, wherein a horizontal thickness of the second gate dielectric region 227 is greater than that of the first gate dielectric region (the thickness of the remaining portions of the first gate dielectric layer 207). FIG. 2I (1) is a top view illustrating a partial structure after the second gate dielectric region 227 is formed. FIG. 2I(2) is a cross-sectional view taken along the cutting line C2I as depicted in FIG. 2H(1).

In the present embodiment, the forming of the second gate dielectric region 227 includes steps as follows: a thermal oxidation process is performed to growth thermal oxide material in the spaces 212A, 212B, 212C and 212D serving as the second gate dielectric region 227. Alternatively, in some other embodiments, the second gate dielectric region 227 can be formed by a deposition process (e.g., a LPCVD process) directly depositing a dielectric layer (e.g., including silicon dioxide or high-k dielectric material) into the spaces 212A, 212B, 212C and 212D. The second gate dielectric region 227 can be formed by pure $SiO_2$, or formed by $SiO_2$ mixed with N, H, F or the arbitrary combination thereof, or formed by $SiN/SiO_2$.

As shown in FIG. 2I(2), the horizontal thickness T21 between the gate conductive regions 208A and the side silicon surface 205s1 of the doped region 215 (or the remaining drain region 205A) facing the gate conductive regions 208A is greater than the horizontal thickness T22 between the gate conductive regions 208A and the side silicon surface 211s1 of the channel region 211A. The horizontal thickness T23 between the gate conductive regions 208A and the slope silicon surface 205s2 facing the gate conductive regions 208A is also greater than the horizontal thickness T22. The horizontal thickness T21 is greater than the horizontal thickness T23. Furthermore, the horizontal thickness T24 between the gate conductive regions 208A and the side silicon surface 205s3 of the source region 206 is greater than the horizontal thickness T25 between the gate conductive regions 208A and the side silicon surface 211s2 of the channel region 211A. In other words, the re-growth second gate dielectric region 227 has thicker thickness than that of the first gate dielectric layer 207 both at the gate-to-drain overlap area 213 and the gate-to-source overlap area 214.

Then, forming SiN to fill the remaining spaces of the gate recesses 201A and 210 B. After a series steps of downstream process are performed, the forming of the buried word line the DRAM cell 20 (including the NMOS transistors 21 and 22) can be implemented. Wherein the drain region 205A, the source region 206 and the drain region 205B of the NMOS transistors 21 and 22 can be respectively connected to the storage node-1, the bit line BL and the storage node-2 of the buried word line DRAM cell 20 (not shown in FIG. 2I(2)).

In sum, because the re-growth second gate dielectric region 227 has thickness both at the gate-to-drain overlap area 213 and the gate-to-source overlap area 214 thicker than that of the first gate dielectric layer 207, thus the electric field effectively at these localized areas can be reduced to achieve GIDL reduction without impact device operation performance for the NMOS transistors 21 and 22.

Embodiment 2

According to one embodiment of the present disclosure, the method for forming a transistor structure includes steps as follows:

Step S31: preparing a semiconductor substrate with an original surface;

Step S32: forming source and drain regions, a first gate dielectric layer and a gate conductive region respectively, wherein the gate conductive region is surrounded by the first gate dielectric layer, and a portion of the first gate dielectric layer is disposed at the gate-to-drain overlap area; wherein the step S22 includes steps as follows;

Step S321: forming a doped region in the semiconductor substrate;

Step S322: using a nitride hard mask layer to form at least one gate recess in the semiconductor substrate and dividing the doped region into the drain region and a source region;

Step S323: forming a channel region in the gate recess, wherein the channel layer is a doped layer within the semiconductor substrate (optionally);

Step S324: forming a gate dielectric layer in the gate recess; and

Step S325: forming the gate conductive region in the gate recess and surrounded by the first gate dielectric layer;

Step S33: increasing a space between the drain region and the gate conductive region at a gate-to-drain overlap area; wherein the step S33 includes steps as follows Step S331: forming a thin oxide spacer on the sidewalls of the gate recess and extending upwards beyond the original surface;

Step S332: forming a nitride gate cap in the gate recess;

Step S333: removing the thin oxide spacer and the portions of the first gate dielectric layer disposed at a gate-to-drain overlap area; and Step S334: removing portions of the drain region (or the gate conductive region) such that the space between the drain region and the gate conductive region at a gate-to-drain overlap area is increased; and Step S34: forming a second gate dielectric region to fill in the increased gap between the gate conductive region and the drain region, wherein a horizontal thickness of the second gate dielectric region is greater than that of the first gate dielectric region; and forming SiN to fill the remaining spaces of the gate recesses.

Referring to Step S31: preparing a semiconductor substrate 301 with an original surface 301a. FIG. 3A(1) is a top view illustrating a partial structure of the semiconductor substrate 301 used for forming the NMOS transistor, and FIG. 3A(2) is a cross-sectional view taken along the cutting line C3A as depicted in FIG. 3A(1).

In the present embodiment, the semiconductor substrate 301 includes a silicon layer, such as a poly-silicon layer or an amorphous silicon layer. As shown in FIGS. 3A(1) and 3A(2), at least one shallow trench isolator (STI) 302 is then formed in the semiconductor substrate 301 to define an active area for forming the NMOS transistors 31 and 32; a pad oxide layer 303 is formed on the STI 302 and the original surface 301a of the semiconductor substrate 301. The pad oxide layer 303 may include silicon oxide, silicon oxynitride or the combination thereof. The active area is surrounded by the STI 302 and in the p-well 304.

Referring to Step S32: forming a drain/source regions, a first gate dielectric region and a gate conductive region respectively, wherein the gate conductive region 308A is surrounded by the first gate dielectric region 307, and a portion of the first gate dielectric layer 307 is disposed at the gate-to-drain overlap area. The step S32 includes sub-steps S321-S325 described as follows:

Referring to Step S321: forming a doped region 315 in the semiconductor substrate 301. FIG. 3B(1) is a top view illustrating a partial structure after the doped region 315 is formed in the semiconductor substrate 301. FIG. 3B(2) is a cross-sectional view taken along the cutting line C3B as depicted in FIG. 3B(1).

In some embodiments of the present disclosure, the forming of the doped region 315 includes performing at least one ion implantation process to drive a plurality of dopants into the semiconductor substrate 301. In the present disclosure, the doped region 315 may include a highly doped (N+) region and a lightly doped region (n_LDD) (not shown).

Referring to Step S322: using a patterned nitride hard mask layer 309 to form at least one gate recess (such as, the gate recesses 310A and 310B) in the semiconductor substrate 301 and dividing the doped region 315 into at least one drain region (such as, the drain regions 305A and 305B) and one at least one source region (such as, the source region 306), wherein FIG. 3C(1) is a top view illustrating a partial structure after the gate recesses 310A and 310B are formed in the semiconductor substrate 301; and FIG. 3C(2) is a cross-sectional view taken along the cutting line C3C as depicted in FIG. 3C(1).

In Step S322, a patterned nitride hard mask layer 309 having at least one opening (such as, the openings 309a and 309b) is formed on the pad oxide layer 303, and at least one etching process using the patterned nitride hard mask layer 309 as an etching mask is performed to remove portions of the pad oxide layer 303 and portions of the semiconductor substrate 301, so as to define the gate recesses 310A and 310B within the active area and penetrating the doped region 315 and to define the drain regions 305A and 305B and the source region 306 respectively adjacent to the gate recesses 310A and 310B.

In the present embodiment, alternatively, a single photoresist patterning (etching) process may be performed to remove portions of the nitride hard mask layer 309, portions of the pad oxide layer 303 and portions of the semiconductor substrate 301 to define the gate recesses 310A and 310B in the semiconductor substrate 301, as well as to define the drain regions 305A and 305B and the source region 306 respectively adjacent to the gate recesses 310A and 310B.

Referring to Step S323: forming a channel region (such as the channel region 311A) in the gate recess (such as, the gate recess 310A), wherein the channel layer 311A is a doped layer formed within the semiconductor substrate 301. FIG. 3D(1) is a top view illustrating a partial structure after the channel regions 311A and 311B are respectively formed in the gate recesses 310A and 310B. FIG. 3D(2) is a cross-sectional view taken along the cutting line C3D as depicted in FIG. 3D(1).

In the present embodiment, the forming of the channel regions 311A and 311B includes steps as follows: Firstly, a p-type doped polysilicon plug 311P is formed to fill the gate recesses 310A and 310B, and a thermal annealing process is then performed to drive the p-type dopants (e.g, Boron) originally doped in the p-type doped polysilicon plug 311P penetrating through the bottom wall 310Ao and 310Bo as well as the sidewalls 310As and 310Bs of the gate recesses 310A and 310B, so as to form a doped layer (having two separated portions respectively disposed in the gate recesses 310A and 310B and serving as the channel regions 311A and 311B) within the semiconductor substrate 301.

In an alternative embodiment, the forming of the channel regions 311A and 311B includes performing a process selective growth process (e.g., a SEG process or an ALD process) to respectively form a p-type doped polysilicon layer or a silicon-germanium ($Si_{1-x}Ge_x$) layer (not shown) on the bottom wall 310Ao and 310Bo as well as on the sidewalls 310As and 310Bs of the gate recesses 310A and 310B. Wherein each of the channel region 311A and 311B can be a deposited layer (not shown) extending into the gate recess 310A or the gate recess 310B from the semiconductor substrate 301 independently.

Referring to Step S324: forming a first gate dielectric layer (also referred to as the first gate dielectric region) 307 in the gate recess 310A and 310B, FIG. 3E(1) is a top view illustrating a partial structure after the first gate dielectric layer 307 is formed in the gate recesses 310A and 310B. FIG. 3E(2) is a cross-sectional view taken along the cutting line C3E as depicted in FIG. 3E(1).

In the present embodiment, the forming of the first gate dielectric layer 307 includes steps as follows: Firstly, the p-type doped polysilicon plug 311P filled in the gate recesses 310A and 310B is removed by an etching process; and then a thermal oxidation process is performed to growth thermal gate dielectric material on the bottom wall 310Ao and 310Bo as well as the sidewalls 310As and 310Bs of the gate recesses 310A and 310B.

Alternatively, in some other embodiments, the first gate dielectric layer 307 can be a dielectric layer (e.g., including silicon dioxide or high-k dielectric material) formed on the bottom wall 310Ao and 310Bo as well as the sidewalls 310As and 310Bs of the gate recesses 310A and 310B by a deposition process (e.g., a LPCVD process).

Referring to Step S325: forming a gate conductive region (such as the gate conductive region 308A) in the gate recess (such as, the gate recess 310A) and surrounded by the first gate dielectric layer 307. FIG. 3F(1) is a top view illustrating a partial structure after the gate conductive regions 308A and 308B are respectively formed in the gate recesses 310A and 310B. FIG. 3F(2) is a cross-sectional view taken along the cutting line C3F as depicted in FIG. 3F(1).

In the present embodiment, the forming of the gate conductive regions 308A and 308B includes steps as follows: Firstly, a TiN film 316 is formed on the first gate dielectric layer 307 in the gate recesses 310A and 310B by a deposition process (e.g., an atomic layer deposition (ALD) process) and the remaining parts of the gate recesses 310A and 310B are filled with tungsten 317. Then, a planarization process (such as, a chemical mechanical polish (CMP)) using the nitride hard mask layer 309 as a stop layer is performed to remove portions of the TiN film 316 and the tungsten 317 disposed on the nitride hard mask layer 309. Subsequently, an etching back process is performed to remove the portions of the TiN film 316 and the tungsten 317 disposed on the top of the gate recesses 310A and 310B, so as to make the top of the remaining TiN film 316 and the tungsten 317 below the original surface 301a of the semiconductor substrate 301.

Whereby, the remaining portions of the TiN film 316 and the tungsten 317 that are disposed in the gate recesses 310A and 310B, below the original surface 301a of the semiconductor substrate 301, and surrounded by the first gate dielectric layer 307, can be combined to serve as the gate conductive regions 308A and 308B respectively. Wherein, the top surface of the gate conductive regions 308A and 308B could be below the original substrate surface 301a. However, the top surface of the gate conductive regions 308A and 308B is lower than the top surface of the drain regions 305A and 305B, but higher than the bottom of the drain regions 305A and 305B, and thus there is a gate-to-drain overlap area 313 between the drain regions 305A and the gate conductive region 308A; there is another gate-to-drain overlap area between the drain region 305B and the gate conductive region 308B, there is a gate-to-source overlap area 314 between the source region 306 and the gate conductive region 308A; and there is another gate-to-source overlap area between the source region 306 and the gate conductive region 308B.

Meanwhile, a portion of the first gate dielectric layer 307 is disposed at the overlap area between the gate conductive regions 308A and the drain region 305A (or at a gate-to-drain overlap area); a portion of the first gate dielectric layer 307 is disposed at the overlap area between the gate conductive regions 308A and the source region 306 (or at a gate-to-source overlap area), etc.

Referring to Step S33: increasing gap between the drain region and the gate conductive region. The forming of the space includes sub-steps S331-S334 described as follows:

Referring to Step S331: forming a thin oxide spacer 318 on the sidewalls of the gate recesses 310A and 310B and extending upwards beyond the original surface 301a of the semiconductor substrate 301. FIG. 3G(1) is a top view illustrating a partial structure after the thin oxide spacer 318 is formed on the sidewalls of the gate recesses 310A and 310B. FIG. 3G(2) is a cross-sectional view taken along the cutting line C3G as depicted in FIG. 3G(1).

In the present embodiment, the forming of the thin oxide spacer 318 includes steps as follows: Firstly, a deposition process (e.g., a LPCVD process) is performed to form a silicon dioxide film (not shown) covering on the surface of the nitride hard mask layer 309, the sidewalls of the gate recesses 310A and 310B and the top portions of the of the gate conductive regions 308A and 308B by a deposition process.

Subsequently, an etching back process is performed to remove the portions of the silicon dioxide film disposed on the surface of the nitride hard mask layer 309 and the portions of the silicon dioxide film disposed on the top portions of the of the gate conductive regions 308A and 308B, so as to form the thin oxide spacer 318 disposed on the sidewalls of the gate recesses 310A and 310B and to expose the top portions of the of the gate conductive regions 308A and 308B. Wherein, the top surface of the thin oxide spacer 318 could be below the surface of the nitride hard mask layer 309 and extend upwards beyond the original surface 301a of the semiconductor substrate 301.

Referring to Step S332: forming a nitride gate cap (such as, the nitride gate cap 319A) in the gate recess (such as, the gate recess 310A). FIG. 3H(1) is a top view illustrating a partial structure after the nitride gate caps 319A and 319B are respectively formed in the gate recesses 310A and 310B. FIG. 3H(2) is a cross-sectional view taken along the cutting line C3H as depicted in FIG. 3H(1).

In the present embodiment, the forming of the nitride gate caps 319A and 319B includes steps as follows: Firstly, a deposition process (e.g., a LPCVD process) is performed to deposit nitride material on the nitride hard mask layer 309 and fill the gate recesses 310A and 310B; and an etching back process is then performed to remove a portion of the nitride material until the thin oxide spacer 318 is revealed. Such that, the nitride gate caps 319A and 319B that are separated from the nitride hard mask layer 309 through the thin oxide spacer 318, can be formed in the gate recesses 310A and 310B.

Referring to Step S333: removing the thin oxide spacer 318 and the portions of the first gate dielectric layer 307 disposed at a gate-to-drain overlap area 313. FIG. 3I(1) is a top view illustrating a partial structure after the thin oxide spacer 318 and the portions of the gate dielectric layer 307 disposed at a gate-to-drain overlap area 313 are removed. FIG. 3I(2) is a cross-sectional view taken along the cutting line C3I as depicted in FIG. 3I(1).

In the present embodiment, an etching process using a wet dip (including H₄F) is performed to remove thin oxide spacer 318 and the portions of the first gate dielectric layer 307, especially the portions of the first gate dielectric layer 307 disposed at the gate-to-drain overlap areas 313 (including the area between the drain region 305A and the top of the gate conductive region 308A and the area between the drain region 305B and the top of the gate conductive region 310B) and the portions of the first gate dielectric layer 307 disposed at the gate-to-source overlap area 314 (at least including the area between the source region 306 and the top of the gate conductive regions 308A and 308B). In some embodiments of the present disclosure, portions of the pad oxide layer 303 adjacent to the gate recesses 310A and 310B may be also removed by the etching process.

Whereby, the side surface of source region 306 and the drain regions 305A and 305B can be revealed. Meanwhile, several spaces (such as, the spaces 312A, 312B, 312C and 312D) can be respectively created between the drain region 305A and the gate conductive region 308A, between the drain region 305B and the gate conductive region 308B, between the source 306 and the gate conductive region 308A, and between the source 306 and the gate conductive region 308B.

Referring to Step S334: removing portions of the drain region (or the gate conductive region) in the semiconductor substrate 301 disposed at the gate-to-drain overlap area 313 (and at the gate-to-source overlap area 314), wherein FIG. 3J(1) is a top view illustrating a partial structure after the portion of the semiconductor substrate 301 disposed at the gate-to-drain overlap area 313 is removed. FIG. 3J(2) is a cross-sectional view taken along the cutting line C3J as depicted in FIG. 3J(1). Alternatively, portion of the gate conductive region at the gate-to-drain overlap area be removed, just like the drain region, to increase the space between the gate conductive region and the drain region.

In the present embodiment, an etching process using a wet dip (including $HNO_3$, HF and $CO_3COOH$) is performed to remove the portions of the semiconductor substrate 301 exposed from the spaces 312A, 312B, 312C and 312D, the portions of the semiconductor substrate 301 disposed at the gate-to-drain overlap area 313 and the portions of the semiconductor substrate 301 disposed at the gate-to-source overlap area 314, so as to laterally enhance the volumes of the spaces 312A, 312B, 312C and 312D.

In detailed, as shown in FIG. 3J(2), a side silicon surface 305s1 of the doped region 315 (or the remaining drain region 305A) in the drain region 305A facing the gate conductive regions 308A is not aligned with a side silicon surface 311s1 of the channel region 311A which is abutted against the first gate dielectric layer 307 (the first gate dielectric region). The horizontal distance between the gate conductive regions 308A and the side silicon surface of the drain region 305A is larger than that between the gate conductive regions 308A and the side silicon surface 311s1 of the channel region 311A.

The horizontal distance of the space 312D between the drain region 305B and the gate conductive region 308B, the horizontal distance of the space 312B between the source 306 and the gate conductive region 308A and the horizontal distance of the space 312C between the source 306 and the gate conductive region 308B can be also laterally enhanced or increased by the similar way.

Referring to Step S34: forming a second gate dielectric region 327 to fill in the space 312A between the gate conductive region 308A and the drain region 305A, wherein a horizontal thickness of the second gate dielectric region 327 is greater than that of the first gate dielectric region (the thickness of the remaining portions of the first gate dielectric layer 307). FIG. 3K(1) is a top view illustrating a partial structure after the second gate dielectric region 327 is formed. FIG. 3K(2) is a cross-sectional view taken along the cutting line C3K as depicted in FIG. 3K(1).

In the present embodiment, the forming of the second gate dielectric region 327 includes steps as follows: a thermal oxidation process is performed to growth thermal dielectric oxide material in the spaces 312A, 312B, 312C and 312D serving as the second gate dielectric region 327. Alternatively, in some other embodiments, the second gate dielectric region 327 can be formed by a deposition process (e.g., a LPCVD process) directly depositing a dielectric layer (e.g., including silicon dioxide or high-k dielectric material) into the spaces 312A, 312B, 312C and 312D. The second gate dielectric region 327 can be formed by pure $SiO_2$, or formed by $SiO_2$ mixed with N, H, F or the arbitrary combination thereof, or formed by $SiN/SiO_2$.

Thereinafter, a silicon nitride deposition process is then performed to fill the gap (not shown) among the second gate dielectric region 327, the nitride layer 309, and nitride gate caps 319A (and 319B).

As shown in FIG. 3K(2), the horizontal thickness T31 between the gate conductive regions 308A and the side silicon surface 305s1 of the doped region 315 in the drain region 305A facing the gate conductive regions 308A is greater than the horizontal thickness T32 between the gate conductive regions 308A and the side silicon surface 311s1 of the channel region 311A. The horizontal thickness T33 between the gate conductive regions 308A and the slope silicon surface 305s2 facing the gate conductive regions 308A is also greater than the horizontal thickness T32. The horizontal thickness T31 is greater than the horizontal thickness T33. Furthermore, the horizontal thickness T34 between the gate conductive regions 308A and the side silicon surface 305s3 of the source region 306 is greater than the horizontal thickness T35 between the gate conductive regions 308A and the side silicon surface 311s2 of the channel region 311A.

In other words, the re-growth second gate dielectric region 327 has thicker thickness than that of the first gate dielectric layer 307 both at the gate-to-drain overlap area 313 and the gate-to-source overlap area 314. In some embodiments of the present disclosure, the thickness of the second gate dielectric region 327 may be 10%-50% greater than that of the first gate dielectric layer 307. For example, the thickness of the second gate dielectric region 327 may be 120% of the thickness of the first gate dielectric layer 307.

After a series steps of down-stream process are performed, the forming of the buried word line the DRAM cell 30 (including the NMOS transistors 31 and 32) can be implemented. Wherein the drain region 305A, the source region 306 and the drain region 305B of the NMOS transistors 31 and 32 can be respectively connected to the storage node-1, the bit line BL and the storage node-2 of the buried word line DRAM cell 20 (as shown in FIG. 3K(2)).

In sum, because the re-growth second gate dielectric region 327 has thickness both at the gate-to-drain overlap area 313 and the gate-to-source overlap area 314 thicker than that of the first gate dielectric layer 307, thus the electric field effectively at these localized areas can be reduced to achieve GIDL reduction without impact device operation performance for the NMOS transistors 31 and 32.

This invention is to increase localized gate dielectric thickness at gate-to-drain overlap area to effectively reduce electric field on specific region to achieve GIDL reduction without impact device operation performance for the transistor. Through gate dielectric re-growth method to increase dielectric thickness of the gate dielectric layer (the second gate dielectric region) at gate-to-drain localize area for effectively lower down electric field to achieve GIDL reduction. The gate dielectric layer can be formed by pure $SiO_2$, or formed by $SiO_2$ mixed with N, H, F or the arbitrary combination thereof, or formed by $SiN/SiO_2$. The gate dielectric layer also can be formed by a CVD deposition.

Combined with additional anisotropic Si etch to the drain region (source region), the dielectric thickness at gate-to-drain localize area can be further increased to achieve GIDL reduction. The gate electrode (gate conductive region) can be formed by poly-silicon, poly-silicon mixed with silicide or W/TiN or W/TiN/Poly or Poly/W/TiN or the arbitrary combination thereof.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A transistor structure comprising:
   a gate conductive region below an original surface of a substrate;
   a gate dielectric region surrounding the gate conductive region;
   a channel region surrounding the gate dielectric region; and
   a drain region comprising a lightly doped region, horizontally spaced apart from the gate conductive region, wherein the drain region includes a highly doped region;
   wherein the gate dielectric region comprises a first dielectric portion and a second dielectric portion, the first dielectric portion is positioned between the gate conductive region and the drain region, and the second dielectric portion is positioned between the gate conductive region and the channel region; wherein a horizontal thickness of the first dielectric portion aligning to a bottom of the drain region is greater than a horizontal thickness of the second dielectric portion.

2. The transistor structure according to claim 1, wherein the gate dielectric region further comprises a third dielectric portion positioned between the first dielectric portion and the second dielectric portion, wherein the horizontal thickness of the first dielectric portion is greater than that of the third dielectric portion.

3. The transistor structure according to claim 1, wherein a top surface of the gate conductive region is lower than that of the drain region.

4. A transistor structure comprising:
   a gate conductive region below an original surface of a substrate;
   a gate dielectric region surrounding the gate conductive region;
   a channel region surrounding the gate dielectric region; and
   a drain region comprising a lightly doped region, spaced apart from the gate conductive region, wherein the drain region includes a highly doped region;
   wherein a side silicon surface of the highly doped region facing the gate conductive region is not aligned with a side silicon surface of the channel region which is abutted against the gate dielectric region, the gate dielectric region comprises a first dielectric portion and a second dielectric portion; the first dielectric portion is positioned between the gate conductive region and the drain region; the second dielectric portion is positioned between the gate conductive region and the channel region; and a horizontal thickness of the first dielectric portion aligning to a bottom of the drain region is greater than a horizontal thickness of the second dielectric portion.

5. The transistor structure according to claim 4, wherein a horizontal distance between the gate conductive region and the side silicon surface of the highly doped region is larger than a horizontal thickness between the gate conductive region and the side silicon surface of the channel region.

* * * * *